(12) United States Patent
Kim et al.

(10) Patent No.: US 11,552,122 B2
(45) Date of Patent: Jan. 10, 2023

(54) IMAGE SENSOR AND OPERATING METHOD

(71) Applicant: SAMSUNG ELECTRONICS CO., LTD., Suwon-si (KR)

(72) Inventors: Munhwan Kim, Seoul (KR); Youngsun Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 201 days.

(21) Appl. No.: 16/865,618

(22) Filed: May 4, 2020

(65) Prior Publication Data

US 2021/0134872 A1 May 6, 2021

(30) Foreign Application Priority Data

Nov. 5, 2019 (KR) .................. 10-2019-0140187

(51) Int. Cl.
*H01L 27/146* (2006.01)
*H04N 5/374* (2011.01)
*H04N 5/355* (2011.01)
*H04N 5/378* (2011.01)
*H04N 5/3745* (2011.01)

(52) U.S. Cl.
CPC .. *H01L 27/14641* (2013.01); *H01L 27/14603* (2013.01); *H01L 27/14612* (2013.01); *H01L 27/14621* (2013.01); *H01L 27/14645* (2013.01); *H04N 5/3559* (2013.01); *H04N 5/35563* (2013.01); *H04N 5/378* (2013.01); *H04N 5/37455* (2013.01); *H04N 5/35554* (2013.01)

(58) Field of Classification Search
CPC ......... H01L 27/14641; H01L 27/14603; H01L 27/14612; H01L 27/14621; H01L 27/14645; H01L 27/14609; H01L 27/1461; H01L 27/14625; H01L 27/1463; H01L 27/14634; H01L 27/14643; H01L 27/1469; H04N 5/35563; H04N 5/3559; H04N 5/37455; H04N 5/378; H04N 5/35554; H04N 5/3575; H04N 5/37457; H04N 9/04557; H04N 5/347; H04N 5/343
See application file for complete search history.

(56) References Cited

U.S. PATENT DOCUMENTS 9,319,606 B2 4/2016 Nakata et al.
9,319,611 B2 4/2016 Fan
9,571,763 B2 2/2017 Funatsu et al.
(Continued)

FOREIGN PATENT DOCUMENTS

JP 6514076 B2 4/2019

*Primary Examiner* — Abdelaaziz Tissire
(74) *Attorney, Agent, or Firm* — Volentine, Whitt & Francos, PLLC

(57) ABSTRACT

An image sensor includes unit pixels of a first pixel group sharing a first floating diffusion region and associated with a single color filter, and unit pixels of a second pixel group sharing a second floating diffusion region and associated with the single color filter. Control logic may generate an image by obtaining capacitance having a first value from the first floating diffusion region at a first time, and obtaining capacitance having a second value different from the first value from the second floating diffusion region at a second time following the first time. The first pixel group and the second pixel s group have different sensitivity levels.

18 Claims, 24 Drawing Sheets

(56) References Cited

U.S. PATENT DOCUMENTS

| | | | |
|---|---|---|---|
| 9,692,997 B2 | 6/2017 | Hseih et al. | |
| 9,749,556 B2 | 8/2017 | Fettig et al. | |
| 9,769,409 B2 | 9/2017 | Minagawa et al. | |
| 10,110,827 B2 | 10/2018 | Mitsunaga | |
| 10,110,840 B2 | 10/2018 | Velichko | |
| 10,306,191 B2 | 5/2019 | Komori et al. | |
| 2006/0023109 A1* | 2/2006 | Mabuchi | H01L 27/14612 |
| | | | 348/340 |
| 2013/0161485 A1* | 6/2013 | Oh | H01L 27/14612 |
| | | | 250/208.1 |
| 2014/0168489 A1* | 6/2014 | Mishina | H04N 5/3742 |
| | | | 348/300 |
| 2015/0146067 A1* | 5/2015 | Roh | H04N 5/345 |
| | | | 348/308 |
| 2015/0195463 A1* | 7/2015 | Koh | H04N 5/23245 |
| | | | 348/302 |
| 2015/0319379 A1* | 11/2015 | Nussmeier | G01J 5/20 |
| | | | 348/165 |
| 2016/0014353 A1* | 1/2016 | Lee | H04N 5/347 |
| | | | 250/208.1 |
| 2017/0148835 A1 | 5/2017 | Ishiwata et al. | |
| 2018/0241953 A1* | 8/2018 | Johnson | G06K 9/00248 |
| 2019/0222788 A1* | 7/2019 | Nikai | H04N 5/35581 |

\* cited by examiner

IMAGE SENSOR AND OPERATING METHOD

CROSS-REFERENCE TO RELATED APPLICATION(S)

This application claims priority to Korean Patent Application No. 10-2019-0140187 filed on Nov. 5, 2019 in the Korean Intellectual Property Office, the subject matter of which is hereby incorporated by reference.

BACKGROUND

The present disclosure relates to image sensor(s) and operating method(s) for image sensor(s).

Image sensors are semiconductor-based elements capable of converting received electromagnetic energy having a defined bandwidth (e.g., "incident light") into a corresponding electrical signal. Image sensors may include an array of many pixels, as well as various logic circuits configured to drive the pixel array. Each pixel may include a photodiode that generates electrical charge in proportion to incident light and a pixel circuit that converts the charge generated by the photodiode into an electrical signal. Various image sensors are widely applied in many consumer products, such as smartphones, cameras, tablet computers, personal computers (PCs), laptop PCs, televisions, vehicles, household appliances, security systems, etc.

With increased use into a greater variety of products, an increasing demand exists for image sensors having improved noise characteristics, greater dynamic range, faster and more efficient operation and the like.

SUMMARY

Embodiments of the inventive concept provide an image sensor capable of providing a high dynamic range without impairing the performance of the image sensor during a binning operation.

According to an embodiment, an image sensor includes a pixel array including a first pixel group including a first unit pixel and a second unit pixel sharing a first floating diffusion region and associated with a color filter, and a second pixel group including a third unit pixel and a fourth unit pixel sharing a second floating diffusion region and associated with the color filter, a sampling circuit configured to detect at least one reset voltage and at least one pixel voltage from at least one of the first pixel group and the second pixel group, and provide a difference between the reset voltage and the pixel voltage as an analog signal, an analog-to-digital converter configured to compare the analog signal with a ramp voltage to generate a comparison result, convert the comparison result into a digital signal, and provide the digital signal as image data, and a signal processing circuit configured to generate an image using the image data, wherein a pixel voltage of the first pixel group corresponds to charge generated by the first unit pixel and the second unit pixel in response to incident light and summed in the first floating diffusion region, and a pixel voltage of the second pixel group corresponds to charge generated by at least one of the third unit pixel and the fourth unit pixel in response to incident light and summed in the second floating diffusion region.

According to an embodiment, an image sensor includes a pixel array including unit pixels, wherein the unit pixels include a first unit pixel and a columnar-adjacent second unit pixel sharing a first floating diffusion region, associated with a single color filter and forming a first pixel group, and the unit pixels include a third unit pixel and a columnar-adjacent fourth unit pixel sharing a second floating diffusion region, associated with the single color filter and forming a second pixel group, different from the first pixel group. The image sensor also includes control logic configured to generate an image by obtaining capacitance having a first value from the first floating diffusion region at a first time, and obtaining capacitance having a second value different from the first value from the second floating diffusion region at a second time following the first time.

According to an embodiment, an operating method for an image sensor provides; obtaining a reset voltage from at least one of the first pixel group and the second pixel group, summing charge generated by at least one of the first pixel group and the second pixel group in response to incident light, obtaining a pixel voltage corresponding to the summed charge, providing a difference between the reset voltage and the pixel voltage as an analog signal, comparing the analog signal with a ramp voltage to generate a comparison result, and providing the comparison result as image data and generating an image using the image data.

According to an embodiment, an image sensor includes a pixel array including unit pixels, wherein the unit pixels include a first unit pixel and a columnar-adjacent second unit pixel sharing a first floating diffusion region, associated with a first color filter and forming a first pixel group, and the unit pixels include a third unit pixel and a columnar-adjacent fourth unit pixel sharing a second floating diffusion region, associated with a second color filter different from the first color filter and forming a second pixel group different from the first pixel group; and control logic control logic configured to generate an image by obtaining capacitance having a first value from the first floating diffusion region at a first time, and obtaining capacitance having a second value, different from the first value, from the second floating diffusion region at a second time following the first time.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, certain embodiments will be described in some additional detail with reference to the accompanying drawings.

Figure 1:
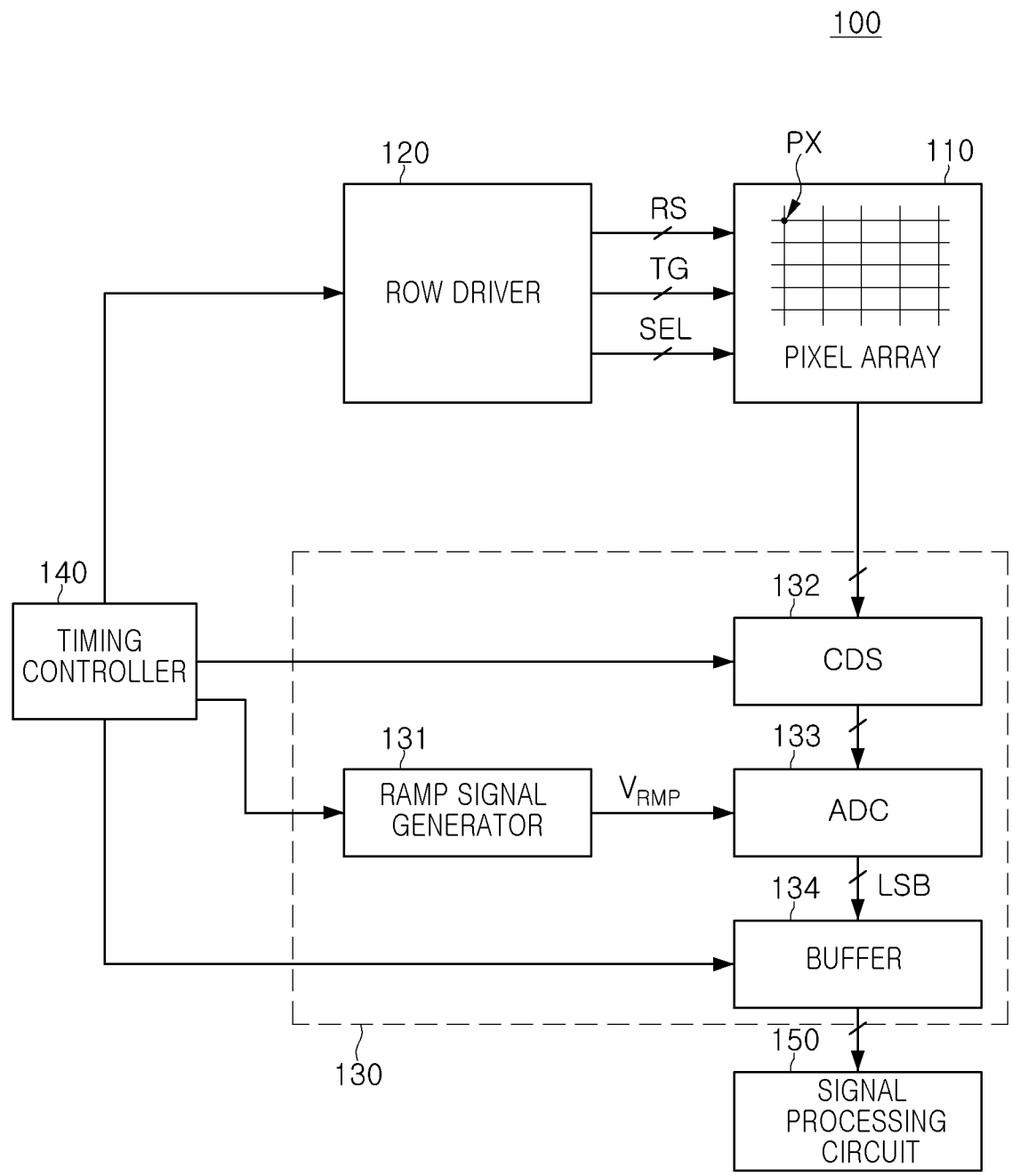
FIG. 1 is a block diagram of an image sensor according to an embodiment.

FIG. 1 is a block diagram illustrating an image sensor 100 according to embodiments of the inventive concept.

Referring to FIG. 1, the image sensor 100 may include a pixel array 110, a row driver 120, a read-out circuit 130, a timing controller 140, and a signal processing circuit 150.

The image sensor 100 may convert received incident light into an electrical signal which may be used to generate image data. The pixel array 110 may include a plurality of pixels PX, wherein each pixel PX may include a photoelectric element (e.g. photodiode PD) that receives incident light and generates corresponding electrical charge (hereafter, "charge"). The plurality of pixels PX may arranged in a matrix—that is, connected in a plurality of row lines extending in a first direction, and a plurality of column lines extending in a second direction. In certain embodiments, each pixel PX may include two or more photodiodes to generate pixel signals corresponding to different colors of light or to provide an autofocusing function.

Each pixel PX may include a pixel circuit configured to generate a pixel signal in response to the charge provided by the photodiode(s). Here, in certain embodiments, the pixel circuit may include a transfer transistor, a driving transistor, a select transistor, a reset transistor and a floating diffusion region. The pixel circuit may output a reset voltage and a pixel voltage. A pixel voltage may correspond (or be proportional) to an amount of charge generated by the photodiode(s) and stored in the floating diffusion region. In certain embodiments, two or more adjacent pixels PX may constitute a pixel group. Two or more pixels PX included in a pixel group may share at least a portion of the transfer transistor, the driving transistor, the select transistor and the reset transistor.

In certain embodiments, among the unit pixels arranged in the pixel array 110, two or more adjacent unit pixels may share a single color filter. Among the unit pixels sharing a single color filter, a first pixel group may share a first floating diffusion region, and the second pixel group may share a second floating diffusion region.

In this regard, the image sensor 100 may variously combine (or sum) the charge provided by respective unit pixels included in the first pixel group and the second pixel group. That is, the image sensor 100 may sum the charge provided by a variable number of unit pixels using a variety of combinatorial approaches to effectively provide pixel groups having different levels of sensitivity to incident light, thereby selectively providing a pixel array having improved dynamic range.

Further in this regard, the image sensor 100 may process electrical signals provided by various pixel groups having (or exhibiting) different sensitivity levels using one or more binning techniques. This capability allows for greater flexibility in the generation of image data.

Referring to FIG. 1, the row driver 120 may apply a driving signal to row lines in order to drive the pixel array 110. With regard to the pixel circuit, the driving signal may include a transfer control signal TG controlling operation of the transfer transistor, a reset control signal RS controlling operation of the reset transistor, and a select control signal SEL controlling operation of the selection transistor. In certain embodiments, the row driver 120 may be used to sequentially drive the row lines.

The read-out circuit 130 may include a ramp signal generator 131, a sampling circuit 132, an analog-to-digital converter (ADC) 133, and a buffer 134. The sampling circuit 132 may include samplers respectively connected to a number of pixels PX through a column line. In certain embodiments, the sampler may be a correlated double sampler (CDS). The sampler may detect a reset voltage and a pixel voltage from pixels PX connected to a selected row line, driven by the row driver 120, from among the row lines. The samplers may output a difference between the reset voltage and the pixel voltage as an analog signal.

The analog-to-digital converter 133 may compare the analog signal with a ramp voltage $V_{RMP}$, and convert the comparison result into a corresponding digital signal. The digital signal may then be provided as image data LSB. The image data LSB may have a value that increases as the difference between the reset voltage and the pixel voltage increases. Accordingly, the image data LSB may have a value that increases with an increase in the intensity of incident light received by a photodiode.

The buffer 134 may be used to temporarily store image data LSB provide by the analog-to-digital converter 133.

The row driver 120 and the read-out circuit 130 may be controlled by the timing controller 140. That is, the timing controller 140 may control the operational timing of the row driver 120 and the read-out circuit 130. Hence, the row driver 120 may control an operation of the pixel array 110 (e.g., in row units) under the control of the timing controller 140.

The signal processing circuit 150 may be used to generate an image in relation to the image data LSB stored in the buffer 134. For example, the signal processing circuit 150 may variously process the image data LSB in order to provide processed image data that may be used to display an image.

Figure 2:
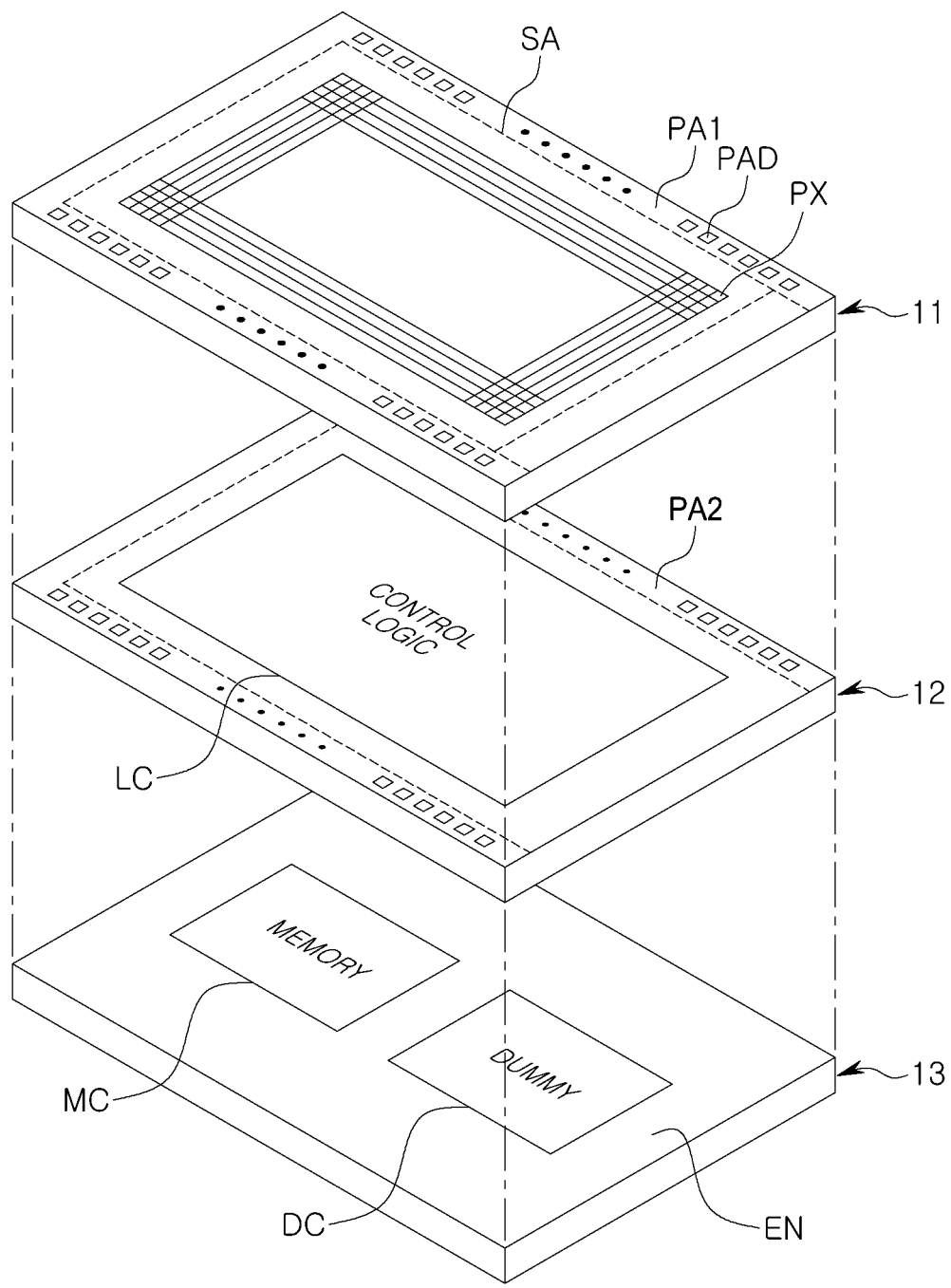
FIGS. 2 and 3 are diagrams further illustrating an image sensor according to embodiments of the inventive concept.
Figure 3:
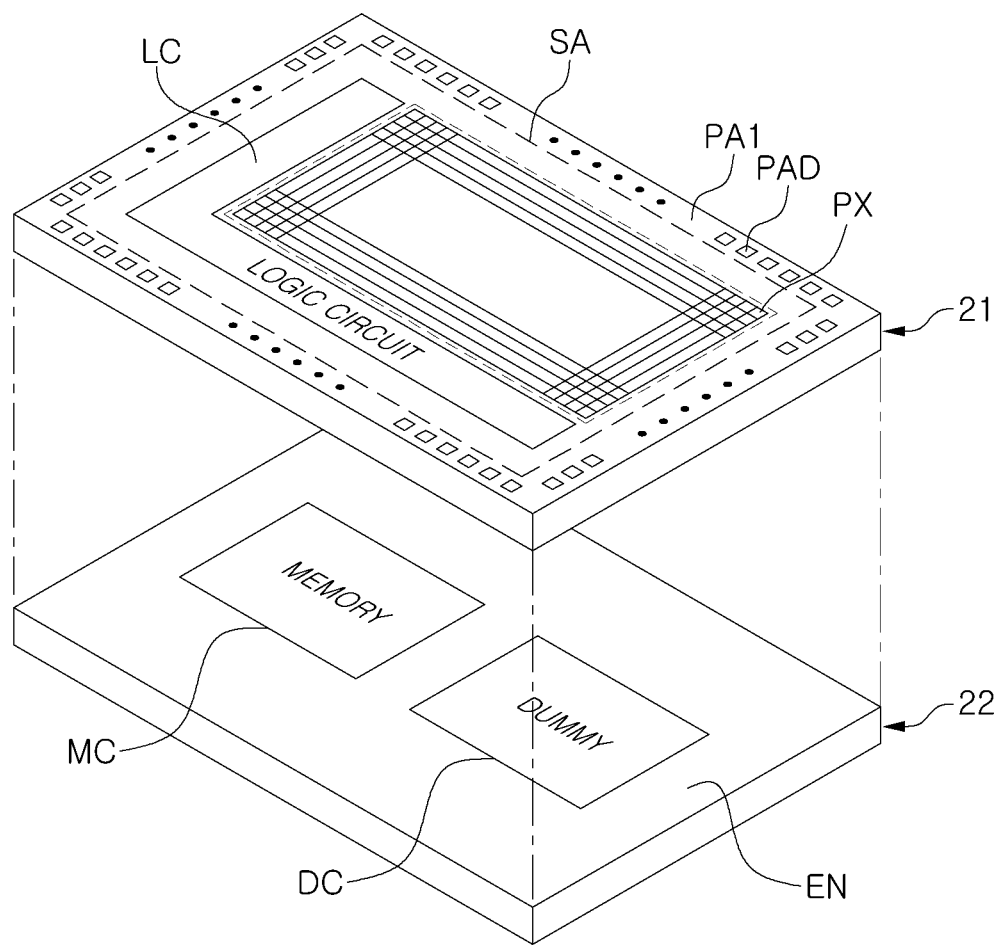

FIGS. 2 and 3 are perspective diagrams further illustrating different approaches to the configuration of an image sensor according to embodiments of the inventive concept.

Referring to FIG. 2, an imaging device 10 may include a first layer 11 disposed on a second layer 12, where the second layer 12 is disposed on a third layer 13. Assuming an arbitrary geometric orientation for purposes of description, the second layer 12 and first layer 11 may be understood as being sequentially and vertically stacked on the third layer 13. In certain embodiments, the first layer 11 may be stacked on the second layer 12 at a wafer level, and the third layer 13 may be attached to the combination of the first layer 11 and second layer 12 at a chip level. The operative combination of the first layer 11, second layer 12 and third layer 13 provides a semiconductor package.

In the illustrated example of FIG. 2, the first layer 11 includes a sensing area SA including pixels PX. A first pad area PA1 may be arranged on at least one side of the sensing area SA in the first layer 11 and a second pad area PA2 may be arranged on at least one side of control logic LC in the second layer 12. A plurality of upper pads PAD in the first pad region PA1 and a plurality of lower pads PAD in the second pad region PA2 maybe variously interconnected (e.g., using in part various through silicon vias) to provide a variety of electrical connections (or signal paths) between elements arranged in the sensing area SA and the control logic LC.

Here, the control logic LC of the second layer 12 may include a variety of circuits (e.g., row drivers, column drivers timing controllers, etc.) that may be used to configure and drive the pixels PX (e.g., the constituent pixel circuits) provided in the first layer 11. In this regard, the control logic LC may provide various control signals applied to the pixels PX. For example, the control logic LC may obtain a reset voltage and a pixel voltage from the pixels PX to generate a pixel signal.

In certain embodiment, one or more of the pixels PX may include a plurality of photodiodes disposed at a same level. Pixel signals generated from the charge generated by the plurality of photodiodes may have phase difference(s) one from the other. The control logic LC may provide an autofocusing function based on the phase difference(s) of pixel signals generated by the plurality of photodiodes included in a pixel PX.

In the illustrated example of FIG. 2, the third layer 13 may include a memory chip MC and a dummy chip DC, as well as an encapsulation layer EN encapsulating the memory chip MC and the dummy chip DC. The memory chip MC may be a dynamic random-access memory (DRAM) or a static random access memory (SRAM). The dummy chip DC does not store data. The memory chip MC may be electrically connected to one or more elements in the control logic LC of the second layer 12 using one or more well understood packaging techniques (e.g., conductive bumps, mircobumps, etc.). Here, the memory chip MC may be used to store digital image data and related information that may be used to generate or display an image, or perform additionally data or signal processing (e.g., provide an autofocusing function).

Referring to FIG. 3, an imaging device 20 may include a first layer 21 and a second layer 22, where the first layer 21 includes the sensing area SA and the control logic region LC. The first pad area PA1 may be provided on at least one side of the combined sensing area SA and control logic LC. A plurality of pads PAD may be variously connected to a memory chip MC disposed on the second layer 22, where the second layer 22 includes the memory chip MC, the dummy chip DC and the encapsulation layer EN.

Figure 4:
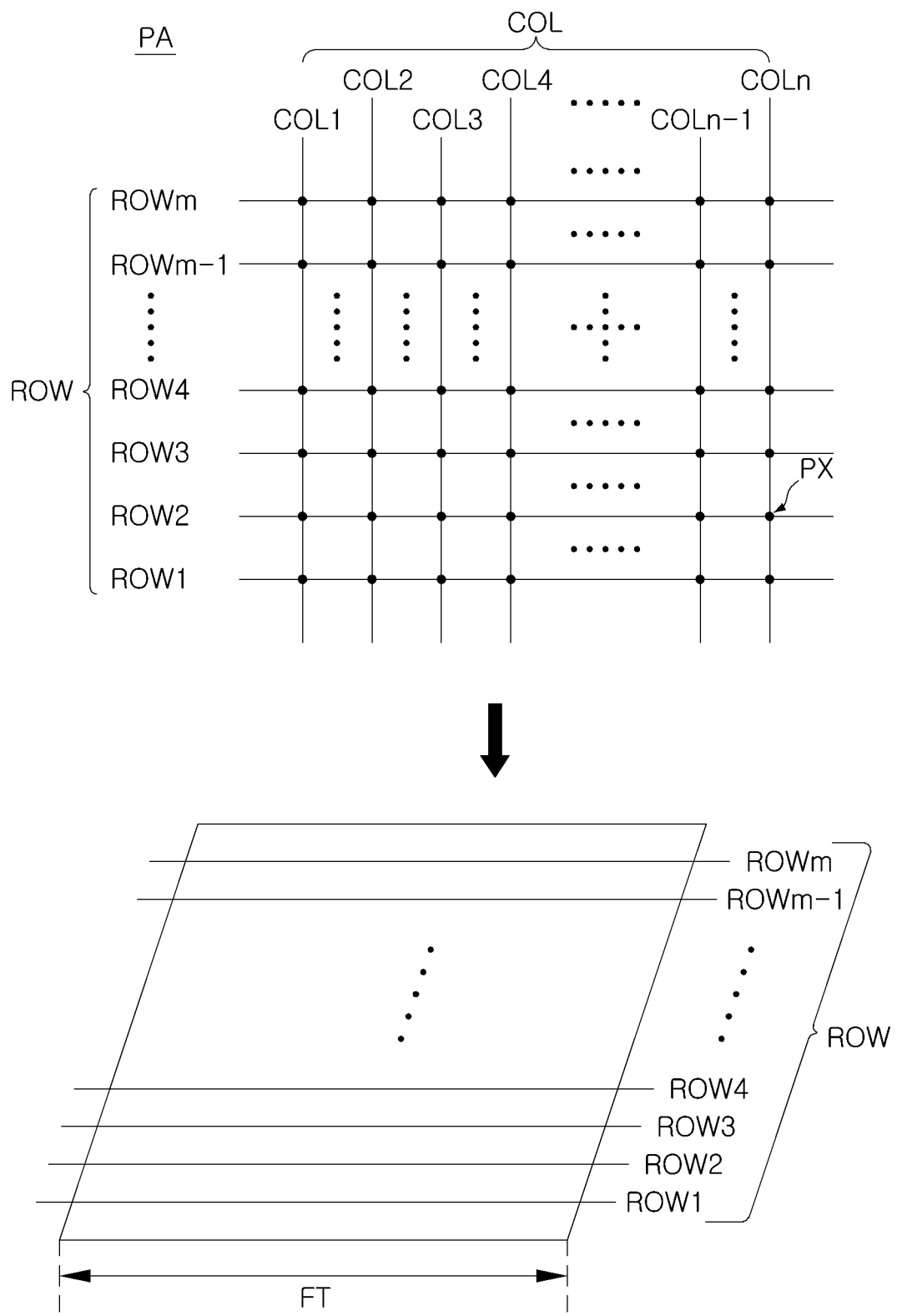
FIG. 4 illustrates an operation of an image sensor according to embodiments of the inventive concept.

FIG. 4 is a diagram further illustrating a pixel array PA that may be used, in part, as the pixel array 110 of FIG. 1 according to embodiments of the inventive concept.

Referring to FIG. 4, the pixel array PA may include a pixels PX, where the pixels PX are arranged in a matrix having row lines ROW (ROW1 to ROWm) and column lines COL (COL1 to COLn). An image sensor incorporating the pixel array PA of FIG. 4 may drive the pixels PX according to row units (e.g., using control signals variously applied to the row lines ROW). As an example, the time (or duration) required to drive a selected driving line among the row lines ROW and read a reset voltage and a pixel voltage from the pixels PX connected to the selected driving line may be defined as a horizontal period. The image sensor may operate in a rolling shutter manner in which the row lines ROW are sequentially driven in a particular order.

A frame period FT for the image sensor may be defined as the time required to read a reset voltage and a pixel voltage from all pixels PX of the pixel array PA. For example, the frame period FT may greater than or equal to the number of row lines ROW times the horizontal period. The shorter the frame period FT for the image sensor, the faster the image sensor may provide image frames.

Figure 5:
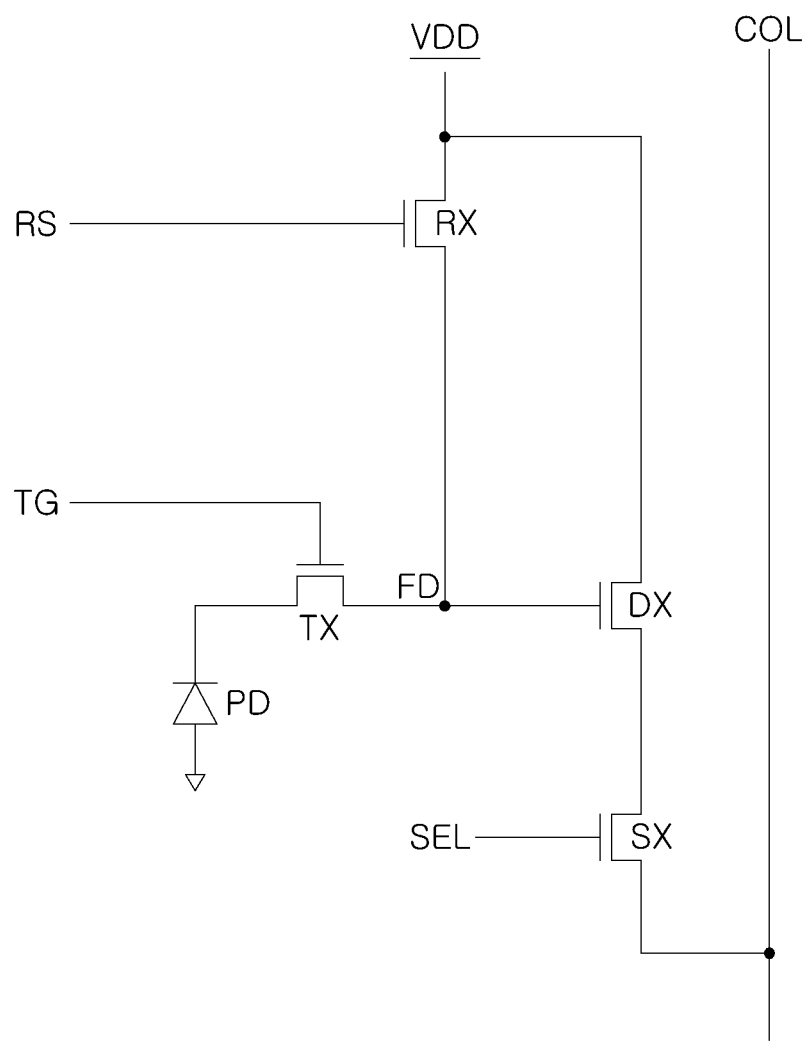
FIG. 5 is a circuit diagram illustrating a pixel included in an image sensor according to embodiments of the inventive concept.

FIG. 5 is a circuit diagram illustrating a pixel that may be included in an image sensor according to embodiments of the inventive concept.

Referring to FIG. 5, the illustrated pixel may include a photodiode PD that generates charge in response to incident light, and a pixel circuit that provides an electrical signal corresponding to the charge generated by the photodiode PD. Here, for example, the pixel circuit may include a reset transistor RX, a driving transistor DX, a select transistor SX and a transfer transistor TX.

The reset transistor RX is selectively turned ON/OFF by a reset control signal RS. When the reset transistor RX is turned ON, a voltage of a floating diffusion region FD may be reset to a power supply voltage VDD. When the voltage of the floating diffusion region FD is reset, the select transistor SX is turned ON by a select control signal SEL to output a reset voltage to a column line COL.

In certain embodiments, the photodiode PD may react to incident light to generate charge (i.e., electrons and/or holes). When the transfer transistor TX is turned ON after the reset voltage is output to the column line COL, the charge generated when the photodiode PD receives incident light may migrate to the floating diffusion region FD. The driving transistor DX may operate as a source-follower amplifier configured to amplify a voltage of the floating diffusion region FD. When the select transistor SX is turned ON by the select control signal SEL, a pixel voltage corresponding to the charge generated by the photodiode PD may be output to the column line COL.

Each of the reset voltage and the pixel voltage may be detected by a sampling circuit connected to the column line COL. The sampling circuit may include a plurality of samplers, each having a first input terminal receiving a reset voltage and a second input terminal receiving a pixel voltage. The sampler may compare the reset voltage, input to the first input terminal, and the pixel voltage input to the second input terminal. An analog-to-digital converter ADC may be connected to an output terminal of a sampler, and may output image data corresponding to a result obtained by comparing the reset voltage and the pixel voltage. The signal processing circuit may generate an image using image data.

Figure 6:
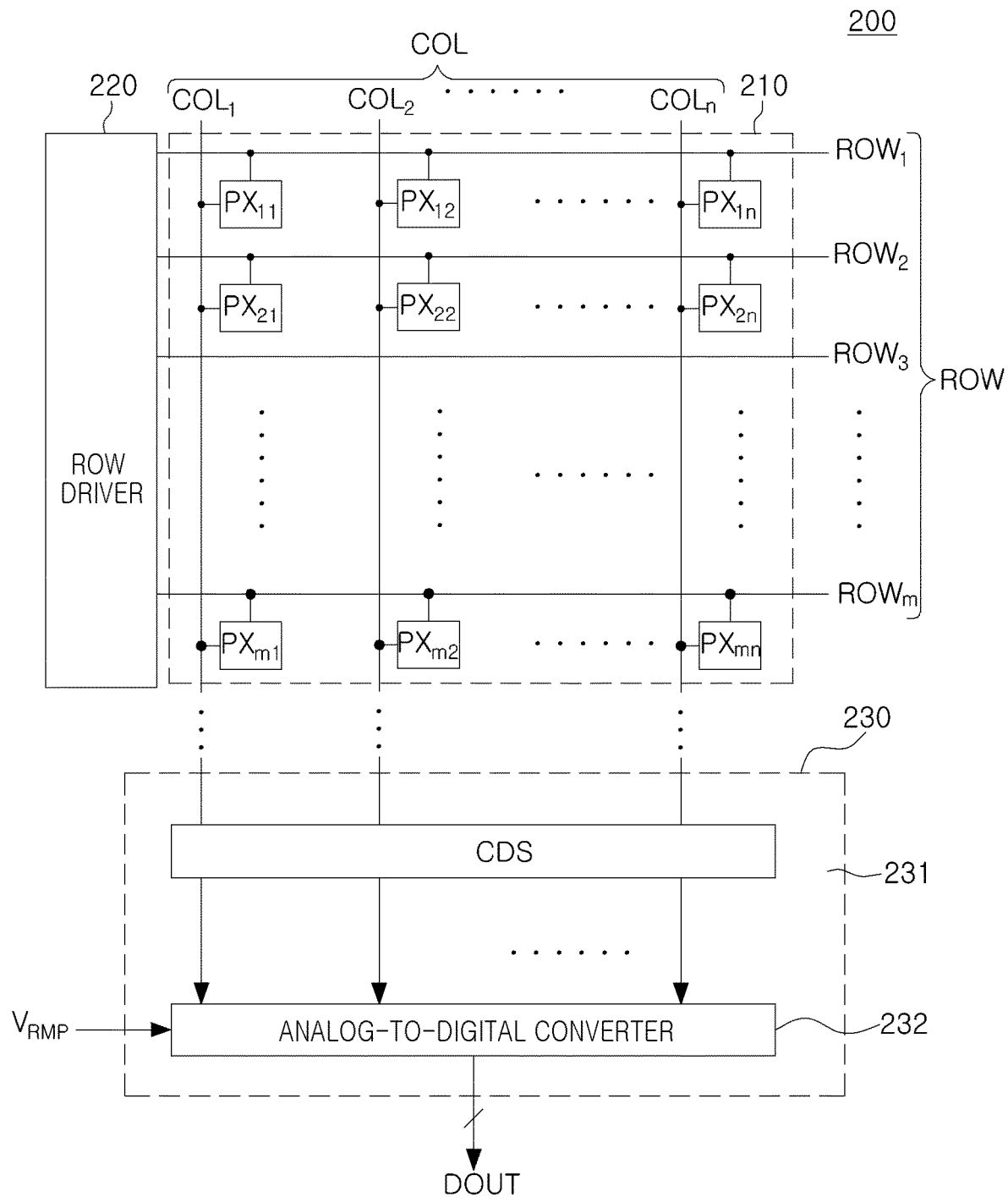
FIG. 6 illustrates an operation of an image sensor according to embodiments of the inventive concept.

FIG. 6 is a diagram illustrating one possible approach to the operation of an image sensor according to embodiments of the inventive concept.

Referring to FIG. 6, an image sensor 200 may include a pixel array 210, a row driver 220 and a read-out circuit 230. The pixel array 210 may include a plurality of row lines ROW (ROW1 to ROWm), extending in one direction, and column lines COL (COL1 to COLn) intersecting the row lines ROW. The row lines ROW and the column lines COL may be connected to pixels PX11 to PXmn, and each of the pixels PX11 to PXmn may include a photodiode and a pixel circuit.

The row driver 220 may apply (e.g.) a transmission control signal, a reset control signal and a select control signal to each of the pixel circuit through row lines ROW (ROW1 to ROWm). The read-out circuit 230 may detect a pixel voltage and a reset voltage through the column line COL from pixels PX connected to a row line ROW selected by the row driver 220. The read-out circuit 230 may include a sampling circuit 231 configured to output a difference between the pixel voltage and the reset voltage, an analog-to-digital converter 232 configured to convert outputs of the sampling circuit 231 into digital data DOUT, and the like.

The image sensor 200 may operate in a binning mode or a full mode. While operating in the binning mode, a binning operation may be performed on pixels associated with the same color filter among the unit pixels PX11 to PXmn included in the pixel array 210 when the image sensor 200 generates an image. During the full mode, image generation is performed using information provided by all of the pixels of the pixel array 210.

Heretofore, individual pixels included in a pixel array may have been implemented with different levels of sensitivity in order to improve the image sensor's dynamic range (i.e., the range of incident light intensity which may be sensed by the image sensor). Thus, pixels having different physical sizes may have been implemented in a pixel array in an attempt to improve a dynamic range. However, such configurations suffer from low spatial layout utilization as well as an overly complicated fabrication process, as physically different pixels (e.g., pixels of different size) must be fabricated. Heretofore, in other attempts to improve dynamic range, pixels having different effective integration times (EIT) have been implemented in a pixel array. However, the binning mode frame rate of the resulting image sensors is effectively limited to only that of the full mode.

In contrast, image sensors according to embodiments of the inventive concept include a pixel array of unit pixels, where each unit pixel exhibits a same sensitivity. Among the unit pixels, two or more adjacent unit pixels may share a color filter, where respective charge outputs of the unit pixels sharing a color filter may be variously combined (e.g., summed). Here, since an image sensor according to embodiments of the inventive concept may sum charge in variable combinations, unit pixels may be combined to form pixel groups having different sensitivity levels. Thus, the image sensor may process image data output from pixel groups having different sensitivity levels that may nonetheless be subject to a binning process to generate an image. As a result, a binning mode frame rate may be higher than a full mode frame rate, because the image sensor may variously sum to provide pixel groups having different sensitivity levels and process image data output from the pixel groups using a binning technique.

Furthermore, image sensors according to embodiments of the inventive concept may be more efficiently fabricated as unit pixels may be implemented with uniform characteristics (e.g., size).

Figure 7:
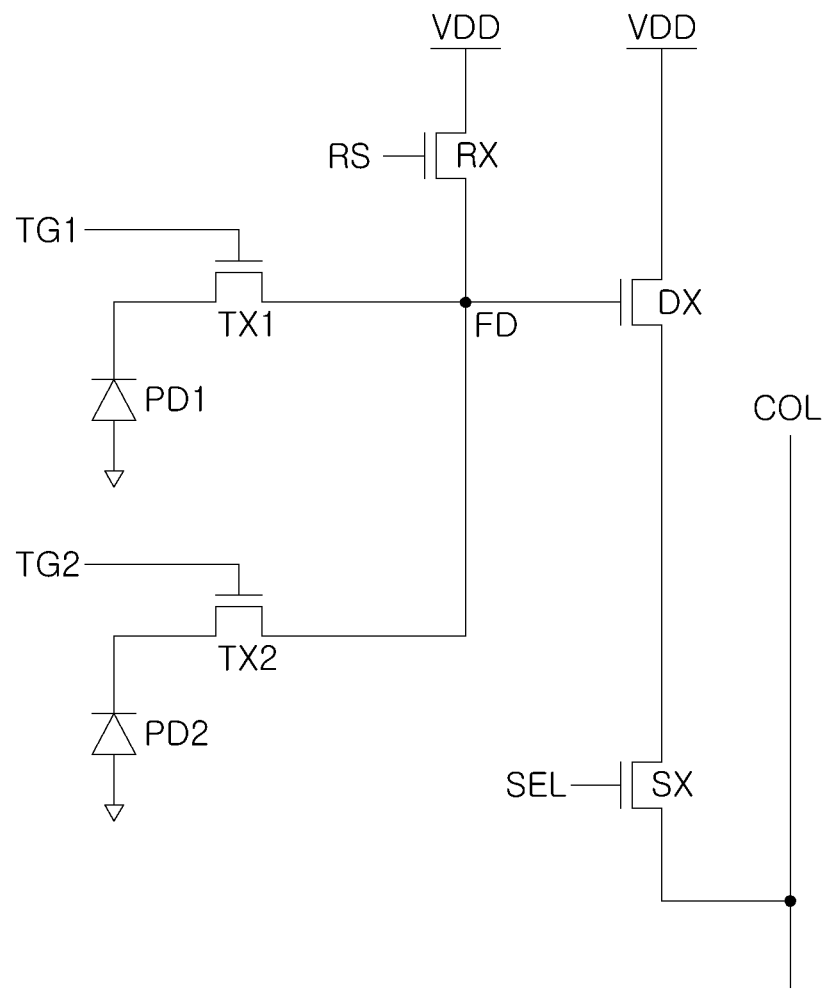
FIG. 7 is a circuit diagram illustrating a pixel group included in a pixel array of an image sensor according to embodiments of the inventive concept.

FIG. 7 is a circuit diagram illustrating of a pixel group that may be included in a pixel array of an image sensor according to embodiments of the inventive concept.

Here, a pixel array may include two or more unit pixels sharing a color filter, among a plurality of color filters, wherein unit pixels sharing a color filter are referred to as a "pixel group." Unit pixels included in a pixel group may share a same floating diffusion region. Unit pixels included in a pixel group may include a photodiode and a transfer transistor connected to the photodiode. A pixel group may include a pixel circuit, wherein the pixel circuit may include a driving transistor, a select transistor, and a reset transistor.

Referring to FIG. 7, a pixel group according to embodiments of the inventive concept may include a first photodiode PD1, a second photodiode PD2, a first transfer transistor TX1, and a second transfer transistor TX2, a reset transistor RX, a driving transistor DX, and a select transistor SX. The first transfer transistor TX1 may be connected to the first photodiode PD1, and the second transfer transistor TX2 may be connected to the second photodiode PD2. A first unit pixel including the first photodiode PD1 and a second unit pixel including the second photodiode PD2 may be shared by a single floating diffusion region FD. In the illustrated example of FIG. 7, it is assumed that the unit pixels have the same full well capacity.

When a pixel voltage is detected, ON/OFF timing of the first transfer transistor TX1 connected to the first photodiode PD1 and the second transfer transistor TX2 connected to the second photodiode PD2 may be independently and variously adjusted within the image sensor.

For example, the first transfer transistor TX1 may be turned ON in response to a first transfer control signal TG1. When the first transfer transistor TX1 is turned ON, charge generated by the first photodiode PD1 may be accumulated in the floating diffusion region FD. When the select transistor is turned ON, a read-out circuit may detect a pixel voltage corresponding to the amount of the charge accumulated in the floating diffusion region FD through a column line COL.

Then, the second transfer transistor TX2 may be turned ON in response to a second transfer control signal TG2. When the second transfer transistor TX2 is turned ON, charge generated by the second photodiode PD2 may accumulate in the floating diffusion region FD. The amount of the charge, accumulated in the floating diffusion region FD, may be output through the column line COL. When the select transistor is turned ON, the read-out circuit may detect a pixel voltage corresponding to the amount of the charge accumulated in the floating diffusion region FD through the column line COL.

According to certain embodiments, ON/OFF timing of the first transfer transistor TX1 connected to the first photodiode PD1 and the second transfer transistor TX2 connected to the second photodiode PD2 may be adjusted to be the same by the image sensor.

For example, the first transfer transistor TX1 may be turned ON in response to the first transfer control signal TG1. At the same time, the second transfer transistor TX2 may be turned ON in response to the second transfer control signal TG2. As the first transfer transistor TX1 and the second transfer transistor TX2 are turned ON at the same time, the amount of charge generated by the first photodiode PD1 and the amount of charge generated by the second photodiode PD2 are summed in the floating diffusion region FD. Then, when the select transistor SX is turned ON, the read-out circuit may detect a pixel voltage corresponding to the amount of summed charge through the column line COL.

Figure 8:
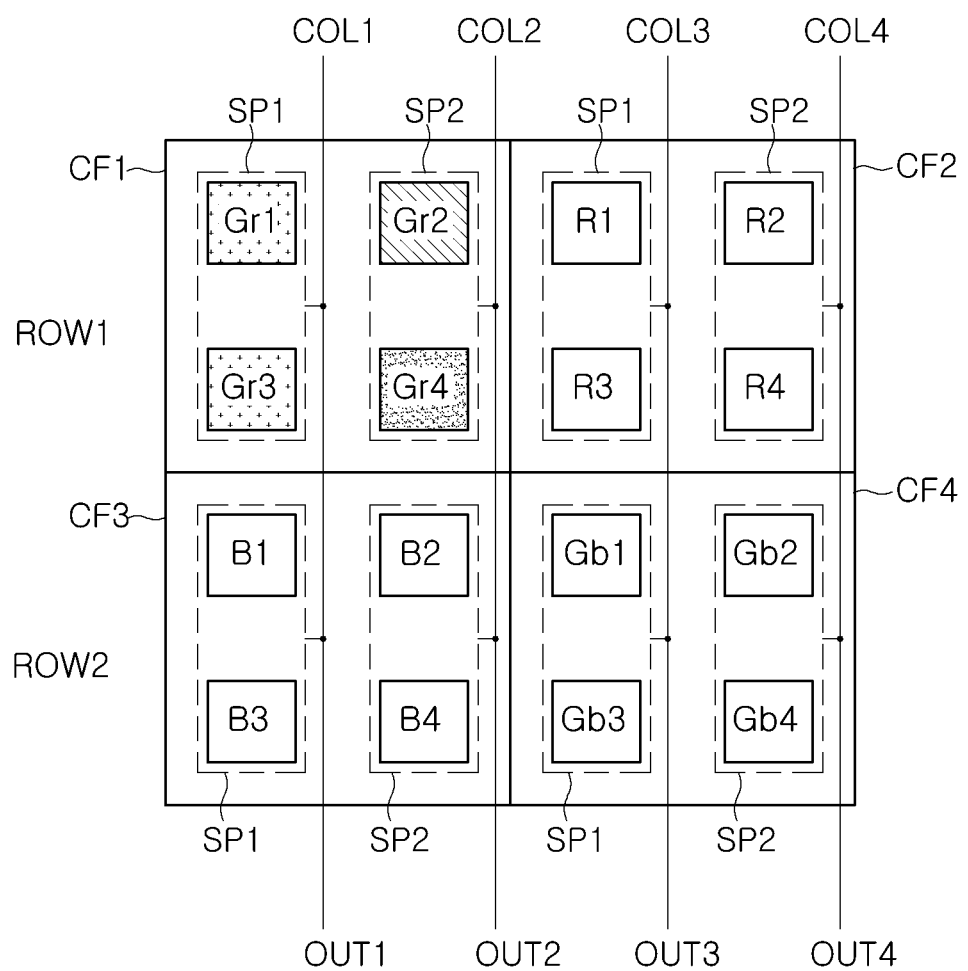
FIG. 8 is a diagram illustrating a pixel array of an image sensor according to embodiments of the inventive concept.

FIG. 8 is a diagram illustrating, in part, a pixel array for an image sensor according to embodiments of the inventive concept.

Referring to FIG. 8, two or more unit pixels sharing a color filter (and which may also share a floating diffusion region) may be physically and/or functionally grouped (hereafter, "merged") to form a pixel group.

For example, 2-by-2 green unit pixels Gr1 (e.g., a first unit pixel), Gr2 (e.g., a second unit pixel), Gr3 (e.g., a third unit pixel), and Gr4 (e.g., a fourth unit pixel) may be merged in association with a first color filter CF1; 2-by-2 red unit pixels R1, R2, R3, and R4 may be merged in associated with a second color filter CF2; 2-by-2 blue unit pixels B1, B2, B3, and B4 may be merged in associated with a third color filter CF3, and 2-by-2 green unit pixels Gb1, Gb2, Gb3, and Gb4 may be merged in associated with a fourth color filter CF4.

Among the unit pixels sharing a single color filter, columnar-adjacent unit pixels may be merged into a pixel group sharing a floating diffusion region. Thus, in relation to the illustrated example of FIG. 8, first green unit pixel Gr1 and columnar-adjacent third green unit pixel Gr3 may be merged to form a first pixel group SP1, and second green unit pixel Gr2 and columnar-adjacent fourth green unit pixel Gr4 may be merged to form a second pixel group SP2, etc.

Referring collectively to FIGS. 7 and 8, an image sensor binning operation will now be described in relation to unit pixels sharing a color filter. In the first pixel group SP1 of the first color filter CF1, the first green unit pixel Gr1 may include the first photodiode PD1 and the third green unit pixel Gr3 may include the second photodiode PD2. The first unit pixel including the first photodiode PD1 and the second unit pixel including the second photodiode PD2 may be shared by a floating diffusion region FD.

Here, it is assumed that the ON/OFF timing of the first transfer transistor TX1 connected to the first photodiode PD1 and the second transfer transistor TX2 connected to the second photodiode PD2 are adjusted to be the same. Thus, the first transfer transistor TX1 and the second transfer transistor TX2 are turned ON at the same time, the charge generated by the first photodiode PD1 as well as charge generated by the second photodiode PD2 are summed in the floating diffusion region FD. In this case, capacitance of the floating diffusion region FD may have a first capacitance value. As the charge generated by the first photodiode PD1 and the charge generated by the second photodiode PD2 are summed, it has the effect as doubling the size (e.g., the incident light area) of a single, conceptual photodiode that might be used in former implementations. Thus, the effective, incident light receiving area of the first pixel group is double that of the constituent unit pixels.

When the select transistor SX is then turned ON, the read-out circuit may detect a first pixel voltage corresponding to the summed charge in the floating diffusion region FD through the first column line COL1.

By way of comparison with the foregoing description of the first pixel group SP1, in the second pixel group SP2 of the first color filter CF1, the second green unit pixel Gr2 may include the first photodiode PD1 and the fourth green unit pixel Gr4 may include the second photodiode PD2. Here again, the first photodiode PD1 and the second photodiode PD2 shared by a floating diffusion region FD.

However, the ON/OFF timing of the first transfer transistor TX1 connected to the first photodiode PD1 and the second transfer transistor TX2 connected to the second photodiode PD2 is assumed to be different.

For example, when the first transfer transistor TX1 is turned ON, the charge generated by the first photodiode PD1 may be accumulated in the floating diffusion region FD. In this case, the capacitance of the floating diffusion region FD may have a second capacitance value. Then, when the select transistor SX is turned ON, the read-out circuit may detect a second pixel voltage corresponding to the charge accumulated in the floating diffusion region FD through the second column line COL2.

When the second transfer transistor TX2 is then turned ON, the charge generated by the second photodiode PD2 may be accumulated in the floating diffusion region FD. In this case, the capacitance of the floating diffusion region FD may have a third capacitance value. When the select transistor SX is then turned ON, the read-out circuit may detect a third pixel voltage corresponding to the charge accumulated in the floating diffusion region FD through the second column line COL2.

In effect, a first subgroup, a second subgroup, and a third subgroup may provide different capacitances in the floating diffusion region FD. For example, a second capacitance value of the second subgroup and a third capacitance value of the third subgroup may be equal to each other, and the first capacitance value of the first subgroup may be greater than the second capacitance value.

Accordingly, the first subgroup, the second subgroup, and the third subgroup may have different sensitivity levels. For example, the sensitivity of the second subgroup and the sensitivity of the third subgroup may be the same, and the sensitivity of the first subgroup may be higher than the sensitivity of the second subgroup and the sensitivity of the third subgroup. As a result, a light receiving area of the second subgroup and a light receiving area of the third subgroup may be equal to each other, and a light receiving area of the first subgroup may be larger than a light receiving area of the second subgroup and a light receiving area of the third subgroup.

The read-out circuit may output first image data corresponding to the first pixel voltage, second image data corresponding to the second pixel voltage, and third image data corresponding to the third pixel voltage.

The signal processing circuit may average image data output from subgroups sharing a single color filter in order to calculate an average value. For example, respecting to the first color filter CF1, the signal processing circuit may average the first image data generated by the first subgroup, the second image data generated by the second subgroup, and third image data generated by the third subgroup to calculate a first average value.

The foregoing approach may be used in relation to the other color filters (e.g., the second color filter CF2 to calculate a second average value; the third color filter CF3 to calculate a third average value; and the fourth color filter CF4 to calculate a fourth average value).

The signal processing circuit may generate raw data using the first average value for the first color filter CF1, the second average value for the second color filter CF2, the third average value for the third color filter CF3, and the fourth average value for the fourth color filter CF4. In this regard, the signal processing circuit may interpolate colors using the raw data and may output an image accordingly.

Figure 9:
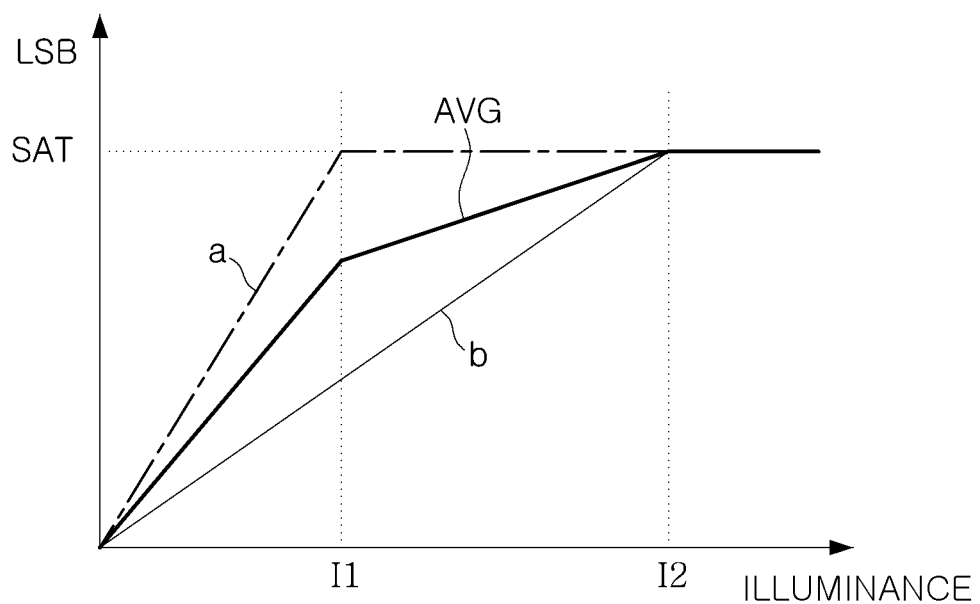
FIG. 9 illustrates sensitivity of an image sensor according to embodiments of the inventive concept.

FIG. 9 is a graph illustrating image data (LSB) sensitivity (e.g., the output of an analog-to-digital converter) as a function of incident light illuminance for an image sensor according to embodiments of the inventive concept.

Referring collectively to FIGS. 8 and 9, plot line 'a' of FIG. 9 indicates the first image data generated by first pixel group SP1 associated with the first color filter CF1 of FIG. 8, and plot line 'b' of FIG. 9 indicates the second/third image data generated by the second pixel group SP2 associated with the first color filter CF1 of FIG. 8.

The first image data corresponds to the charge generated by the first photodiode of the first pixel group SP1 and the charge generated by the second photodiode. The second image data corresponds to charge generated by the first photodiode of the second pixel group SP2, and the third image data corresponds to charge generated by the second photodiode of the second pixel group SP2.

Since the light receiving areas of the second and third subgroups of the second pixel group SP2 are the same, the second and third subgroups of the second pixel group SP2 exhibit the same sensitivity. Accordingly, the second/third subgroups have the same plot line 'b'.

Since the light receiving area of the first subgroup of the first pixel group SP1 is larger than the light receiving area of the second/third subgroups of the second pixel group SP2, the first subgroup of the first pixel group SP1 has a higher sensitivity than the second/third subgroups of the second pixel group SP2. Thus, plot 'a' is different from plot 'b'.

An analog input value—which may be provided by the analog-to-digital converter—may have an allowable range. When an applied input results in an image data that falls outside the allowable range, the input may result in a saturation value output SAT that falls within the allowable range. For example, the analog-to-digital converter may indicate a resolution of up to 10 bits. In this case, the analog-to-digital converter may output 0 to 1023LSB, where the saturation value SAT may be 1023LSB.

When image data is generated from the first subgroup of the first pixel group SP1, an output of the analog-to-digital converter may rapidly approach the saturation value, particularly in relation to image data generated from the second/third subgroup of the second pixel group SP2. (Compare, plot 'a' at first illuminance I1, and plot 'b' at second illuminance I2, higher than the first illuminance I1).

The sensitivity of the image sensor may be increased at low illuminance and may be decreased at high illuminance, such that an imaged object may be more precisely represented in a resulting image. As an example, when the sensitivity of the image sensor is set according to plot 'a', the quality of an image may be deteriorated at high illuminance because the image becomes rapidly saturated. Meanwhile, when the sensitivity of the image sensor is set according to plot 'b', the sensitivity of the image sensor is relatively low at low illuminance, but may be insufficient at high illuminance.

However, when an image is generated by averaging the first image data, the second/third image data, the sensitivity of the image sensor may generate a composite (e.g., an average AVG) of the performances associated with plot 'a' and plot 'b'. In regard to the resulting composite response, the sensitivity of the image sensor may be relatively higher at low illuminance, yet the time required for saturation of an output of the analog-to-digital converter may be delayed. Thus, noise characteristics and dynamic range may be improved in an image sensor according to embodiments of the inventive concept.

Figure 10:
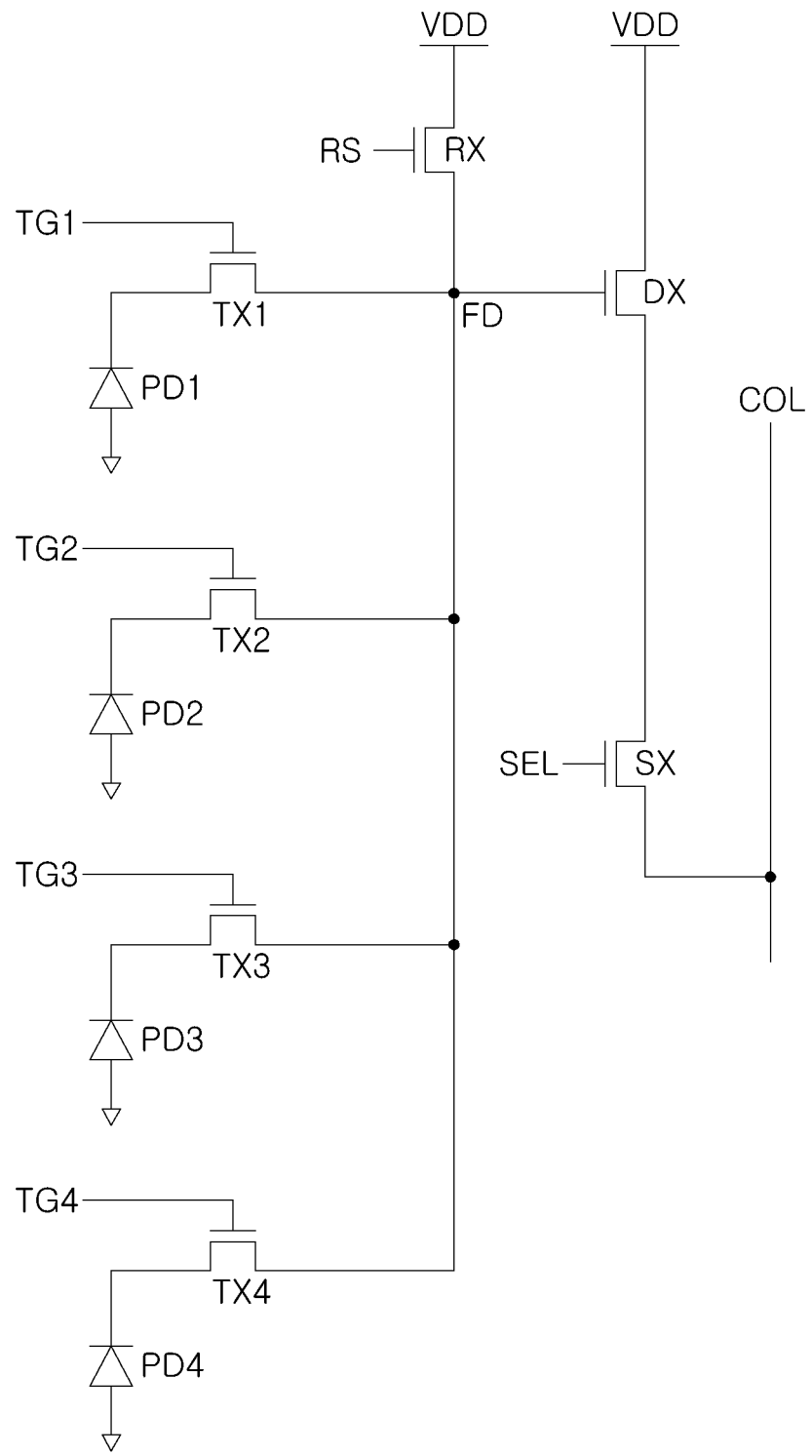
FIG. 10 is a circuit diagram illustrating a pixel group included in a pixel array according to embodiments of the inventive concept.

FIG. 10 is a circuit diagram of another pixel group that may be included in a pixel array of an image sensor according to embodiments of the inventive concept.

Referring to FIG. 10, the pixel group may include first, second, third and fourth (hereafter "first to fourth") photodiodes PD1 to PD4, first to fourth transfer transistors TX1 to TX4, a reset transistor RX, a driving transistor DX, and a select transistor SX. The first transfer transistor TX1 may be connected to the first photodiode PD1, and the second transfer transistor TX2 may be connected to the second photodiode PD2, the third transfer transistor TX3 may be connected to the third photodiode PD3, and the fourth transfer transistor TX4 may be connected to the fourth photodiode PD4. A first unit pixel including the first photodiode PD1, a second unit pixel including the second photodiode PD2, a third unit pixel including the third photodiode PD3, and a fourth unit pixel including the fourth photodiode PD4 may be shared by a single floating diffusion region FD.

According to certain, ON/OFF timing of the first to fourth transfer transistors TX1 to TX4 may be variously adjusted relative to one another by an image sensor when a pixel voltage is detected.

For example, the first transfer transistor TX1 may be turned ON in response to a first transfer control signal TG1. When the first transfer transistor TX1 is turned ON, charge generated by the first photodiode PD1 may be accumulated in the floating diffusion region FD. When the select transistor SX is turned ON, a read-out circuit may detect a pixel voltage corresponding to the amount of the charge, accumulated in the floating diffusion region FD, through a column line COL.

The second transfer transistor TX2 may be then turned ON in response to a second transfer control signal TG2. When the second transfer transistor TX2 is turned ON, charge generated by the second photodiode PD2 may accumulate in the floating diffusion region FD. When the select transistor SX is turned ON, the read-out circuit may detect a pixel voltage corresponding to the amount of the charge, accumulated in the floating diffusion region FD, through the column line COL.

The third transfer transistor TX3 may be then turned ON in response to a third transfer control signal TG3. When the third transfer transistor TX3 is turned ON, charge generated by the third photodiode PD3 may accumulate in the floating diffusion region FD. When the select transistor is turned ON, the read-out circuit may detect a pixel voltage corresponding to the amount of the charge, accumulated in the floating diffusion region FD, through the column line COL.

The fourth transfer transistor TX4 may be then turned ON in response to a fourth transfer control signal TG4. When the fourth transfer transistor TX4 is turned ON, charge generated by the second photodiode PD2 may be accumulated in the floating diffusion region FD. When the select transistor is turned ON, the read-out circuit may detect a pixel voltage corresponding to the amount of the charge, accumulated in the floating diffusion region FD, through the column line COL.

According to certain embodiments, ON/OFF timing of at least one of the first to fourth transfer transistors TX1 to TX4 may be adjusted to be the same by the image sensor.

Figure 11:
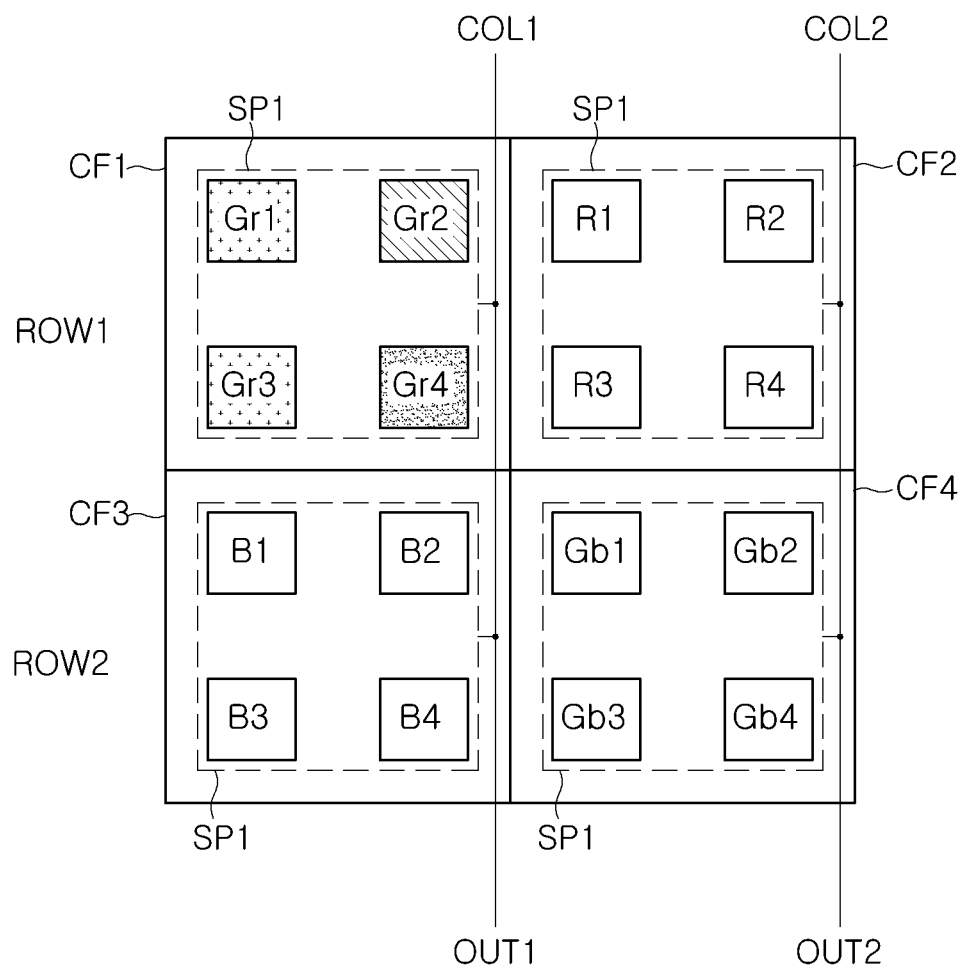
FIGS. 11 and 12 are schematic diagrams of a pixel array of an image sensor according to an embodiment.
Figure 12:
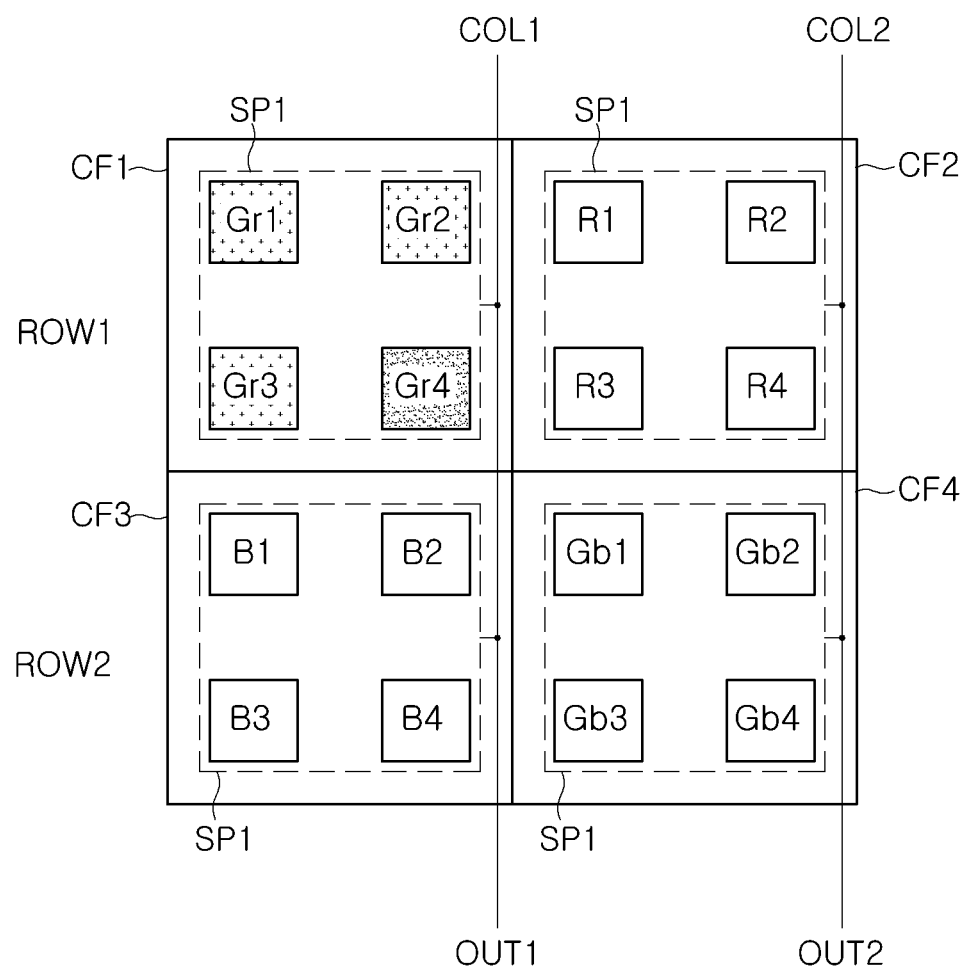

For example, FIG. 11 illustrates an embodiment in which the first transfer transistor TX1 and the third transfer transistor TX3 are simultaneously turned ON, and FIG. 12 illustrates the first transfer transistor TX1, the second transfer transistor TX2, and the third transfer transistor TX3 are simultaneously turned ON.

FIGS. 11 and 12 are respective diagrams illustrating, in part, a pixel array for an image sensor according to embodiments of the inventive concept.

Referring to FIGS. 11 and 12, in a pixel array of an image sensor, two or more unit pixels sharing a single color filter among a plurality of color filters, may share at least one floating diffusion region to provide pixel groups.

For example, 2-by-2 green unit pixels Gr1, Gr2, Gr3, and Gr4 may be merged in associated with a first color filter CF1; 2-by-2 red unit pixels R1, R2, R3, and R4 may be merged in associated with a second color filter CF2; 2-by-2 blue unit pixels B1, B2, B3, and B4 may be merged in associated with a third color filter CF3, and 2-by-2 green unit pixels Gb1, Gb2, Gb3, and Gb4 may be merged in associated with a fourth color filter CF4.

Unit pixels merged in associated with a single color filter form a pixel group sharing a single floating diffusion region.

For example, green unit pixels Gr1, Gr2, Gr3, and Gr4 merged in associated with the first color filter CF1 may form a first pixel group SP1; red unit pixels R1, R2, R3, and R4 merged in associated with the second color filter CF2 may form a first pixel group SP1; blue unit pixels B1, B2, B3, and B4 merged in in associated with the third color filter CF3 may form a first pixel group SP1, and green unit pixels Gb1, Gb2, Gb3, and Gb4 merged in associated with the fourth color filter CF4 may form a first pixel group SP1.

Referring to FIGS. 10 and 11, a description will be given with regard to a binning operation performed by the image sensor according to an embodiments of the inventive concept.

In the first pixel group SP1 of the first color filter CF1, the first green unit pixel Gr1 may include the first photodiode PD1, the second green unit pixel Gr2 may include the second photodiode PD2, the third green unit pixel Gr3 may include the third photodiode PD3, and the fourth green unit pixel Gr2 may include the fourth photodiode PD4. A first unit pixel including the first photodiode PD1, a second unit pixel including the second photodiode PD2, a third unit pixel including the third photodiode PD3, and a fourth unit pixel including the fourth photodiode PD4 may be shared by a single floating diffusion region FD.

The ON/OFF timing of the first transfer transistor TX1 connected to the first photodiode PD1 and the third transfer transistor TX3 connected to the third photodiode PD3 may be the same. In this case, the first unit pixel and the third unit pixel may constitute a first subgroup.

The ON/OFF timing of the second transfer transistor TX2 connected to the second photodiode PD2 and the fourth transfer transistor TX4 connected to the fourth photodiode PD4 may be different from each other. That is, the ON/OFF timing of each of the second transfer transistor TX2 and the fourth transfer transistor TX4 may be different from the ON/OFF timing of the first transfer transistor TX1 and the third transfer transistor TX3. In this case, the second unit pixel may constitute a second photodiode group, and the fourth unit pixel may constitute a third subgroup.

For example, as the first transfer transistor TX1 and the third transfer transistor TX3 are simultaneously turned ON, the charge generated by the first photodiode PD1 and the charge generated by the third photodiode PD3 may be summed together in the floating diffusion region FD. In this case, capacitance of the floating diffusion region FD may have a first capacitance value. As the amount of the charge generated by the first photodiode PD1 and the charge generated by the third photodiode PD3 are summed together, it has the same effect as doubling the area of the photodiode. Thus, the incident light receiving area of the first subgroup may be increased.

When the select transistor SX is then turned ON, a read-out circuit may detect a first pixel voltage corresponding to the summed charge in the floating diffusion region FD through a first column line COL1.

When the second transfer transistor TX2 is then turned ON, the charge generated by the second photodiode PD2 may be accumulated in the floating diffusion region FD. In this case, the capacitance of the floating diffusion region FD may have a second capacitance value. The charge accumulated in the floating diffusion region FD, may be output through a column line COL. When the select transistor SX is then turned ON, the read-out circuit may detect a second pixel voltage corresponding to the charge accumulated in the floating diffusion region FD through the first column line COL1.

When the fourth transfer transistor TX4 is then turned ON, the charge generated by the fourth photodiode PD2 may be accumulated in the floating diffusion region FD. In this case, the capacitance of the floating diffusion region FD may have a third capacitance value. When the select transistor SX is then turned ON, the read-out circuit may detect a third pixel voltage corresponding to the charge accumulated in the floating diffusion region FD through the first column line COL1.

In effect, the first subgroup, the second subgroup, and the third subgroup may provide different capacitances in the floating diffusion region FD. For example, the second capacitance value of the second subgroup and the third capacitance value of the third subgroup may be the same, and the first capacitance value of the first subgroup may be higher than the second/third capacitance value.

Accordingly, the first subgroup, the second subgroup, and the third subgroup may have different sensitivity levels. For example, the sensitivity of the second subgroup and the sensitivity of the third subgroup may be the same, while the sensitivity of the first subgroup may be higher than the sensitivity of the second/third subgroup. In addition, a light receiving area of the second subgroup and an incident light receiving area of the third subgroup may be the same, while the incident light receiving area of the first subgroup may be larger than the light receiving area of the second/third subgroup.

The read-out circuit may output first image data corresponding to the first pixel voltage, may output second image data corresponding to the second pixel voltage, and may output third image data corresponding to the third pixel voltage.

The signal processing circuit may generate a composite (e.g., take an average) of the image data provided by the subgroups sharing a single color filter in order to calculate a composite value (e.g., an average value). For example, respecting to the first color filter CF1, the signal processing circuit may take an average of the first image data generated from the first subgroup, the second image data generated from the second subgroup, and the third image data generated from the third subgroup to calculate a first average value.

Respecting to the second color filter CF2, the signal processing circuit may take an average of the first image data generated from the first subgroup, the second image data generated from the second subgroup, and the third image data generated from the third subgroup to calculate a second average value.

Respecting to the third color filter CF3, the signal processing circuit may take an average of the first image data generated from the first subgroup, the second image data generated from the second subgroup, and the third image data generated from the third subgroup to calculate a third average value.

Respecting to the fourth color filter CF4, the signal processing circuit may take an average of the first image data generated from the first subgroup, the second image data generated from the second subgroup, and the third image data generated from the third subgroup to calculate a fourth average value.

The signal processing circuit may generate raw data using the first average value of the first color filter CF1, the second average value of the second color filter CF2, the third average value of the third color filter CF3, and the fourth average value of the fourth color filter CF4.

The signal processing circuit may interpolate a color using the raw data and may output an image.

The pixel array of FIG. 12 will be described while focusing on differences from the pixel array of FIG. 11.

Referring to FIGS. 10 and 12, the ON/OFF timing of a first transfer transistor TX1 connected to a first photodiode PD1, a second transfer transistor TX2 connected to a second photodiode PD1, and a third transfer transistor TX3 connected to a photodiode PD3 may be the same. In this case, a first unit pixel, a second unit pixel, and a third unit pixel may constitute a first subgroup.

The ON/OFF timing of the fourth transfer transistor TX4 connected to the fourth photodiode PD4 may be different from those of the first to third transfer transistors TX1 to TX3. In this case, a fourth unit pixel may constitute a second subgroup.

For example, as the first to third transfer transistors TX1 to TX3 are simultaneously turned ON, the charge generated by the first photodiode PD1, the charge generated by the second photodiode PD2, and the charge generated by the third photodiode PD3 may be summed together in the floating diffusion region FD. In this case, capacitance of the floating diffusion region FD may have a first capacitance value. The incident light receiving area of the first subgroup may effectively be increased as the charge generated by the first photodiode PD1, the charge generated by the second photodiode PD2, and the charge generated by the third photodiode PD3 are summed together.

When the select transistor SX is then turned ON, the read-out circuit may detect a first pixel voltage corresponding to the charge summed in the floating diffusion region FD through the first column line COL1.

When the fourth transfer transistor TX4 is then turned ON, the charge generated by the fourth photodiode PD4 may be accumulated in the floating diffusion region FD. In this case, the capacitance of the floating diffusion region FD may have a second capacitance value. When the select transistor SX is then turned ON, the read-out circuit may detect a second pixel voltage corresponding to the charge accumulated in the floating diffusion region FD through the first column line COL1.

In this manner, the first subgroup and the second subgroup may provide different capacitances in the floating diffusion region FD. For example, a first capacitance value of the first subgroup may be greater than a second capacitance value of the second subgroup.

Thus, the first subgroup and the second subgroup may have different sensitivity levels. For example, the sensitivity of the first subgroup may be higher than the sensitivity of the second subgroup. In addition, the effective incident light receiving area of the first subgroup may be larger than the incident light receiving area of the second subgroup.

The read-out circuit may output first image data corresponding to the first pixel voltage and may output second image data corresponding to the second pixel voltage.

The signal processing circuit may take an average of image data, output from subgroups sharing a single color filter, to calculate an average value. For example, respecting to the first color filter CF1, the signal processing circuit may take an average of the first image data generated from the first subgroup and the second image data generated from the second subgroup to calculate a first average value.

Respecting to the second color filter CF2, the signal processing circuit may take an average of the first image data generated from the first subgroup and the second image data generated from the second subgroup to calculate a second average value.

Respecting to the third color filter CF3, the signal processing circuit may take an average of the first image data generated from the first subgroup and the second image data generated from the second subgroup with respect to the third color filter CF3 to calculate a third average value.

Respecting to the fourth color filter CF4, the signal processing circuit may take an average of the first image data generated from the first subgroup and the second image data generated from the second subgroup with respect to the fourth color filter CF4 to calculate a fourth average value.

The signal processing circuit may generate raw data using the first average value of the first color filter CF1, the second average value of the second color filter CF2, the third average value of the third color filter CF3, and the fourth average value of the fourth color filter CF4.

The signal processing circuit may interpolate a color using the raw data and may output an image.

Figure 13A:
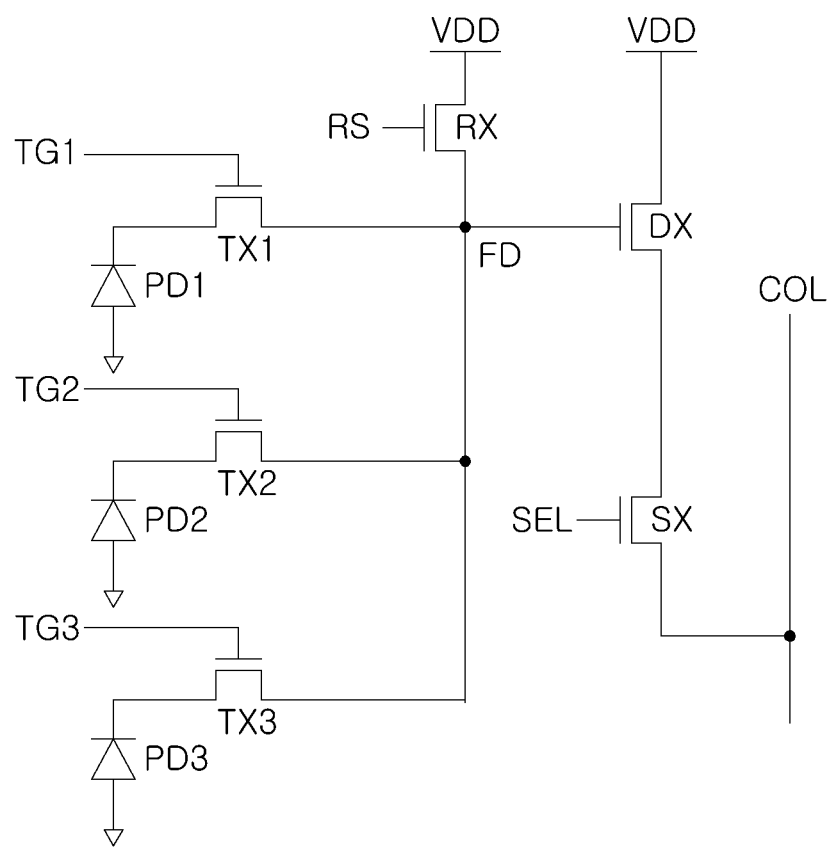
FIGS. 13A to 13C are circuit diagrams illustrating a pixel group included in a pixel array according to embodiments of the inventive concept.
Figure 13B:
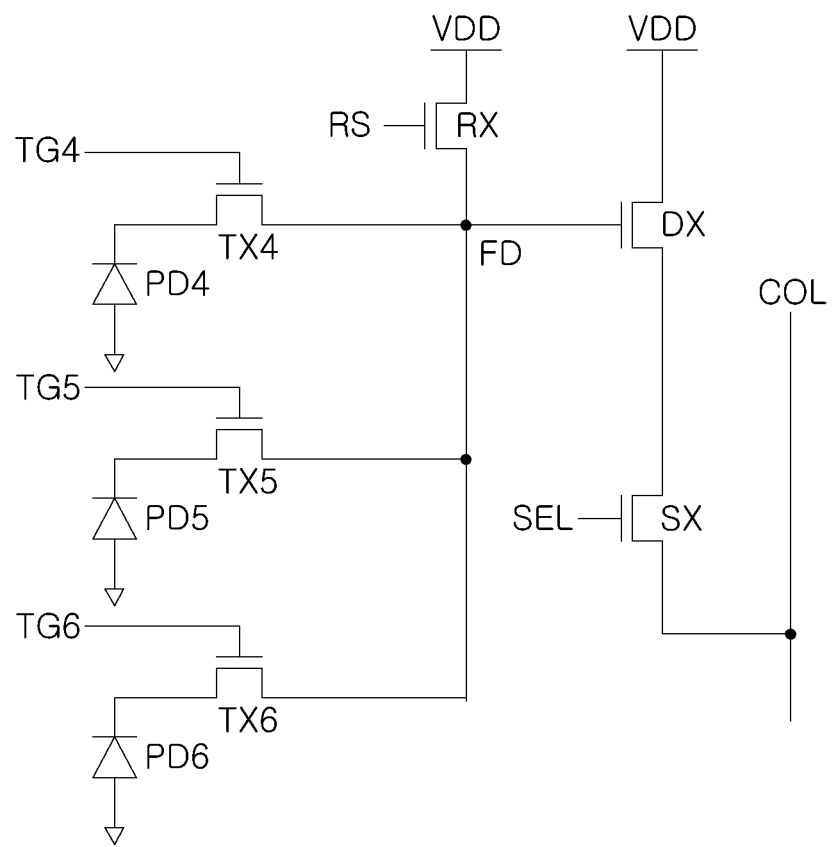
Figure 13C:
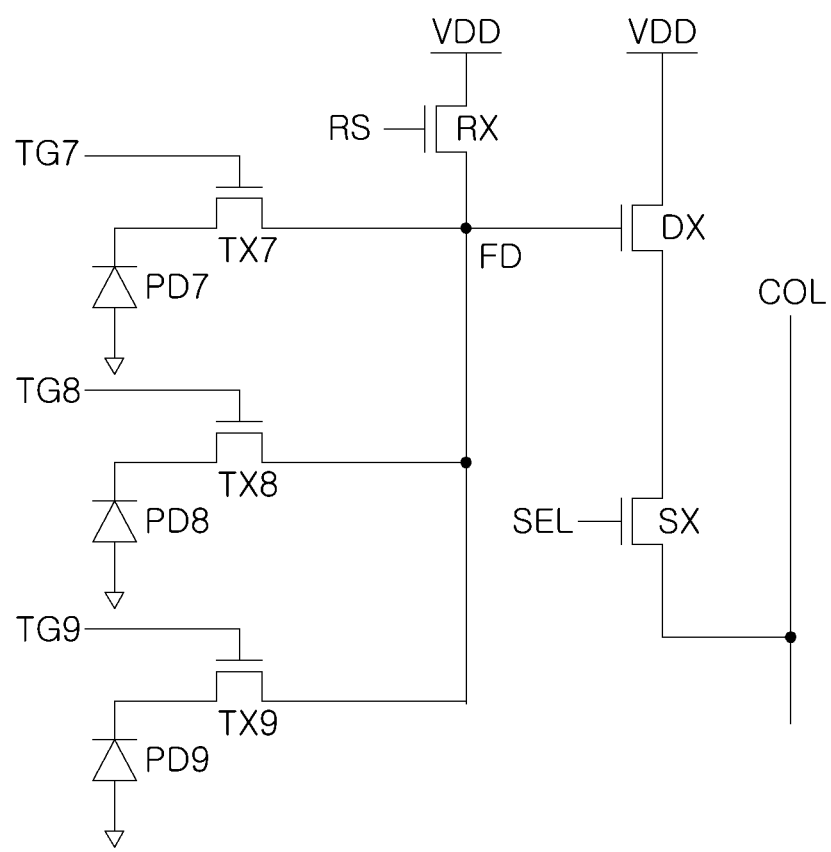

FIGS. 13A, 13B and 13C are respective circuit diagrams illustrating a pixel group that may be included in a pixel array according to embodiments of the inventive concept.

Referring to FIG. 13A, a shared pixel of an image sensor according to an embodiment may include first to third photodiode PD1 to PD3, first to third transfer transistor TX1 to TX3, and a reset transistor RX, a driving transistor DX, and a select transistor SX.

The first transfer transistor TX1 may be connected to a first photodiode PD1, and the second transfer transistor TX2 may be connected to a second photodiode PD2. The third transfer transistor TX3 may be connected to a third photodiode PD3.

A first unit pixel including the first photodiode PD1, a second unit pixel including the second photodiode PD2, and a third unit pixel including the third photodiode PD3 may be shared by a single floating diffusion region FD.

Accordingly, ON/OFF timing of the first to third transfer transistors TX1 to TX3 may be adjusted to be different by the image sensor when the pixel voltage is detected.

For example, the first transfer transistor TX1 may be turned ON in response to a first transfer control signal TG1. When the first transfer transistor TX1 is turned ON, charge generated by the first photodiode PD1 may be accumulated in the floating diffusion region FD. When the select transistor is turned ON, the read-out circuit may detect the pixel voltage corresponding to the charge accumulated in the floating diffusion region FD through a column line COL.

The second transfer transistor TX2 may be then turned ON in response to a second transfer control signal TG2. When the second transfer transistor TX2 is turned ON, charge generated by the second photodiode PD2 may be accumulated in the floating diffusion region FD. When the select transistor is turned ON, the read-out circuit may detect a pixel voltage corresponding to the charge accumulated in the floating diffusion region FD through the column line COL.

The third transfer transistor TX3 may be then turned ON in response to a third transfer control signal TG3. When the third transfer transistor TX3 is turned ON, charge generated by the third photodiode PD3 may be accumulated in the floating diffusion region FD. When the select transistor is turned ON, the read-out circuit may detect a pixel voltage corresponding to the charge accumulated in the floating diffusion region FD through the column line COL.

Here, ON/OFF timing for at least one of the first to third transfer transistors TX1 to TX3 may be adjusted to be the same by the image sensor.

The various elements and connections shown in FIGS. 13B and 13C may be the same or similar to those described in relation to FIG. 13A.

Referring collectively to FIGS. 14, 15, 16, 17 to 18, a description will be given with regard to an embodiment in which ON/OFF timing for at least one of the first to third transfer transistors TX1 to TX3 is adjusted to be the same.

Figure 14:
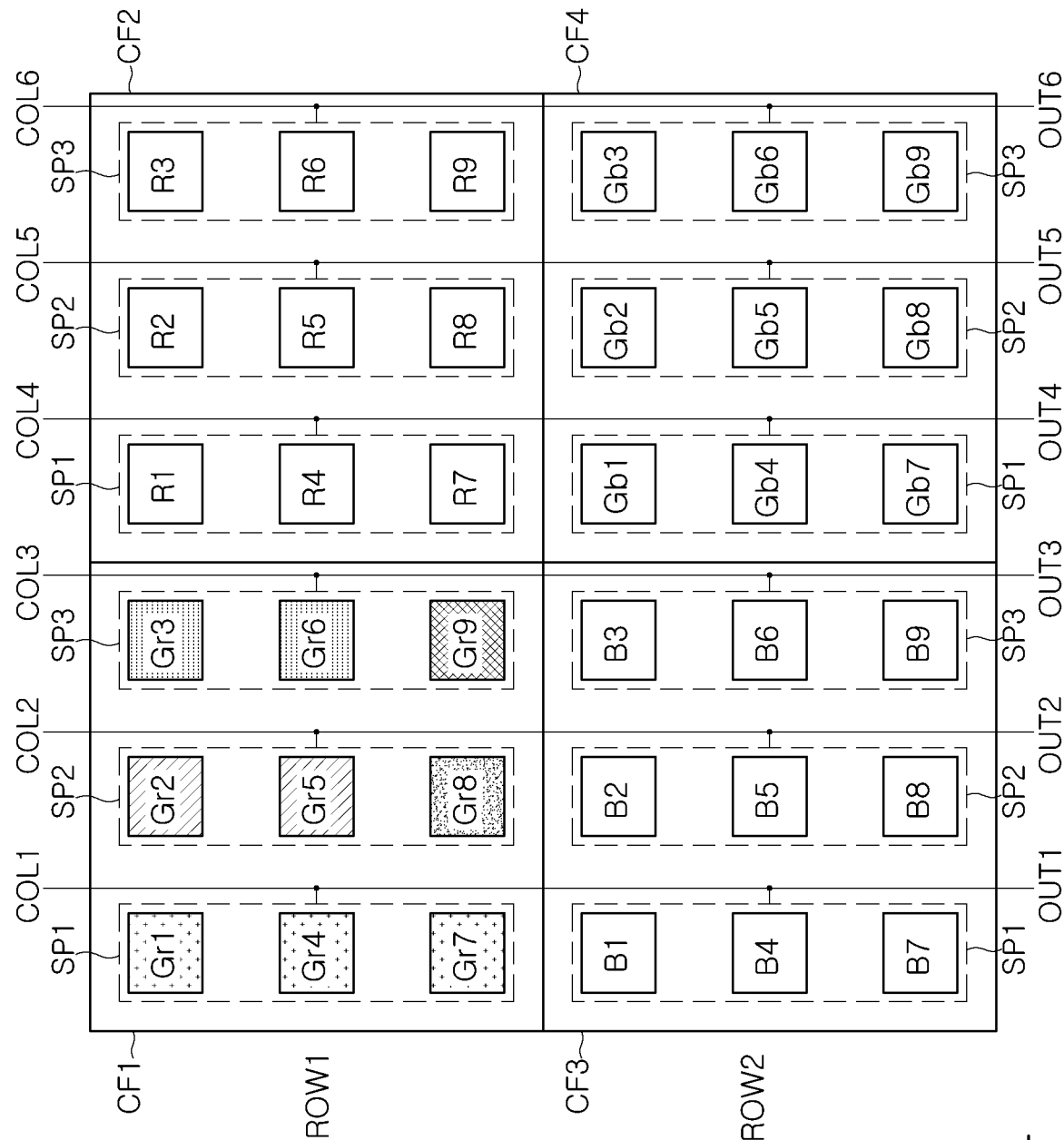
FIG. 14 is a diagram illustrating a pixel array of an image sensor according to embodiments of the inventive concept.

FIG. 14 is a diagram of another pixel array that may be included in an image sensor according to embodiments of the inventive concept.

Referring to FIG. 14, in a pixel array of an image sensor, two or more unit pixels sharing a single color filter among a plurality of color filters may share at least one floating diffusion region to provide pixel groups.

For example, 3-by-3 green unit pixels Gr1 to Gr9 may be merged in associated with a first color filter CF1; 3-by-3 red unit pixels R1 to R9 may be merged in associated with a second color filter CF2; 3-by-3 blue unit pixels B1 to B9 may be merged in associated with a third color filter CF3, and 3-by-3 green unit pixels Gb1 to Gb9 may be merged in associated with a fourth color filter CF4.

Unit pixels merged in associated with a single color filter may variously form a pixel group sharing a single floating diffusion region.

For example, among the green unit pixels Gr1 to Gr9 merged in associated with the first color filter CF1, a first green unit pixel Gr1, a fourth green unit pixel Gr4, and a seventh green unit pixel Gr7 may constitute a first pixel group SP1 corresponding to FIG. 13A. Among the green unit pixels Gr1 to Gr9 merged in association with the first color filter CF1, a second green unit pixel Gr2, a fifth green unit pixel Gr5, and an eighth green unit pixel Gr8 may constitute a second pixel group SP2 corresponding to FIG. 13B. Among the green unit pixels Gr1 to Gr9 merged in associated with the first color filter CF1, a third green unit pixel Gr3, a sixth green unit pixel Gr6, and a ninth green unit pixel Gr9 may constitute a third pixel group SP3 corresponding to FIG. 13C.

Each of the second to fourth color filters CF2 to CF4 may constitute the first to third pixel groups SP1 to SP3 consistent with the foregoing description of illustrated embodiments.

Referring to FIGS. 13A, 13B, 13C and FIG. 14, a description will be given with regard to an operation of an image sensor in a binning mode in which a binning operation is performed on unit pixels sharing a single color filter.

In the first pixel group SP1 of the first color filter CF1, a first green unit pixel Gr1 may include a first photodiode PD1, a fourth green unit pixel Gr4 may include a second photodiode PD2, and a seventh green unit pixel Gr7 may include a third photodiode PD3. A first unit pixel including the first photodiode PD1, a second unit pixel including the second photodiode PD2, and a third unit pixel including the third photodiode PD3 may be shared by a single floating diffusion region FD.

The ON/OFF timing of a first transfer transistor TX1 connected to the first photodiode PD1, a second transfer transistor TX2 connected to the second photodiode PD1, and a third transfer connected to the third photodiode PD3 may be adjusted to be the same. In this case, the first unit pixel, the second unit pixel, and the third unit pixel may constitute a first subgroup.

For example, as the first to third transfer transistors TX to TX3 are simultaneously turned ON, the charge generated by the first photodiode PD1, the charge generated by the second photodiode PD2, and the charge generated by the three photodiodes PD3 may be summed together in the floating diffusion region FD. In this case, capacitance of the floating diffusion region FD may have a first capacitance value. The incident light receiving area of the first subgroup may be increased as the charge generated by the first photodiode PD1, the charge generated by the second photodiode PD2, and the charge generated by the third photodiode PD3 are summed.

When the select transistor SX is then turned ON, a read-out circuit may detect a first pixel voltage corresponding to the charge summed in the floating diffusion region FD through a first column line COL1.

In the second pixel group SP2 of the first color filter CF1, a second green unit pixel Gr2 may include a fourth photodiode PD4, a fifth green unit pixel Gr5 may include a fifth photodiode PD5, and an eighth green unit pixel Gr2 may include Gr8 may include a sixth photodiode PD6. A fourth unit pixel including the fourth photodiode PD4, a fifth unit pixel including the fifth photodiode PD5, and a sixth unit pixel including the sixth photodiode PD6 may be shared by a single floating diffusion region FD.

The ON/OFF timing of the fourth transfer transistor TX4 connected to the fourth photodiode PD4 and the fifth transfer transistor TX5 connected to the fifth photodiode PD5 may be the same. The ON/OFF timing of the third transfer transistor TX3 connected to the six photodiode PD6 may be adjusted to be different from the ON/OFF timing of the fourth transfer transistor TX4 and the fifth transfer transistor TX5.

In this case, the fourth unit pixel and the fifth unit pixel may constitute a second subgroup, and the sixth unit pixel may constitute a third subgroup.

For example, as the fourth transfer transistor TX4 and the fifth transfer transistor TX5 are simultaneously turned ON, the charge generated by the fourth photodiode PD4 and the charge generated by the fifth photodiode PD5 are summed together in the floating diffusion region FD. In this case, capacitance of the floating diffusion region FD may have a second capacitance value. As the charge generated by the fourth photodiode PD4 and the charge generated by the fifth photodiode PD5 are summed, the incident light receiving area of the second subgroup may be increased.

When the select transistor SX is then turned ON, the read-out circuit may detect a second pixel voltage corresponding to the charge summed in the floating diffusion region FD through a second column line COL2.

When the sixth transfer transistor TX6 is then turned ON, charge generated by the sixth photodiode PD6 may be accumulated in the floating diffusion region FD. In this case, capacitance of the floating diffusion region FD may have a third capacitance value. When the select transistor SX is then turned ON, the read-out circuit may detect a third pixel voltage corresponding to the charge accumulated in the floating diffusion region FD through the second column line COL2.

In the third pixel group SP2 of the first color filter CF1, a third green unit pixel Gr3 may include a seventh photodiode PD7, a sixth green unit pixel Gr6 may include an eighth photodiode PD8, and a ninth green unit pixel Gr9 may include a ninth photodiode PD9. A seventh unit pixel including the seventh photodiode PD7, an eighth unit pixel including the eighth photodiode PD8, and a ninth unit pixel including the ninth photodiode PD9 may be shared by a single floating diffusion region FD.

The ON/OFF timing of the seventh transfer transistor TX7 connected to the seventh photodiode PD7 and the eighth transfer transistor TX8 connected to the eighth photodiode PD8 may be the same. The ON/OFF timing of the ninth transfer transistor TX9 connected to the ninth photodiode PD9 may be adjusted be different from the ON/OFF timing of the seventh and eighth transfer transistors TX7 and TX8.

In this case, the seventh unit pixel and the eighth unit pixel may constitute a fourth subgroup, and the ninth unit pixel may constitute a fifth subgroup.

For example, as the seventh transfer transistor TX7 and the eighth transfer transistor TX8 are simultaneously turned ON, the charge generated by the seventh photodiode PD7 and the charge generated by the eighth photodiode PD8 may summed together in the floating diffusion region FD. In this case, capacitance of the floating diffusion region FD may have a fourth capacitance value. As the charge generated by the seventh photodiode PD7 and the charge generated by the eighth photodiode PD8 are summed together, the incident light receiving area of the fourth subgroup may be increased.

When the select transistor SX is then turned ON, the read-out circuit may detect the fourth pixel voltage corresponding to the charge summed in the floating diffusion region FD through a third column line COL3.

When the ninth transfer transistor TX9 is then turned ON, charge generated by the ninth photodiode PD9 may be accumulated in the floating diffusion region FD. In this case, capacitance of the floating diffusion region FD may have a fifth capacitance value. When the select transistor SX is then turned ON, the read-out circuit may detect a fifth pixel voltage corresponding to the charge summed in the floating diffusion region FD through the third column line COL3.

The first to fifth subgroups may provide different capacitances in the floating diffusion region FD. For example, the second capacitance value of the second subgroup and the fourth capacitance value of the fourth subgroup may be the same, and the third capacitance value of the third subgroup and the fifth capacitance value of the fifth subgroup may be the same. The first capacitance value of the first subgroup may be greater than each of the second capacitance value and the third capacitance value.

Thus, the first to fifth subgroups may have different sensitivity levels. For example, the sensitivity of the second subgroup and the sensitivity of the fourth subgroup may be the same, the sensitivity of the third subgroup and the sensitivity of the fifth subgroup may be the same, and the sensitivity of the first subgroup may be greater than the sensitivity of the second subgroup and the sensitivity of the third subgroup. In addition, the incident light receiving area of the second subgroup and the incident light receiving area of the fourth subgroup may be the same, the incident light receiving area of the third subgroup and the incident light receiving area of the fifth subgroup may be the same, and the incident light receiving area of the first subgroup may be greater than each of the light receiving areas of the second subgroup and the third subgroup.

The read-out circuit may output first image data to fifth image data, respectively corresponding to the first pixel voltage to the fifth pixel voltage.

The signal processing circuit may take an average of image data, output from subgroups sharing a single color filter, to calculate an average value. For example, respecting to the first color filter CF1, the signal processing circuit may take an average of the first image data generated from the first subgroup, the second image data generated from the second subgroup, the third image data generated from the third subgroup, and the fourth image data generated from the fourth subgroup, and the fifth image data generated from the fifth subgroup to calculate a first average value.

Respecting to the second color filter CF2, the signal processing circuit may take an average of the first image data generated from the first subgroup, the second image data generated from the second subgroup, the third image data generated from the third subgroup, and the fourth image data generated from the fourth subgroup, and the fifth image data generated from the fifth subgroup to calculate a second average value.

Respecting to the third color filter CF3, the signal processing circuit may take an average of the first image data generated from the first subgroup, the second image data generated from the second subgroup, the third image data generated from the third subgroup, and the fourth image data generated from the fourth subgroup, and the fifth image data generated from the fifth subgroup to calculate a third average value.

Respecting to the fourth color filter CF4, the signal processing circuit may take an average of the first image data generated from the first subgroup, the second image data generated from the second subgroup, the third image data generated from the third subgroup, and the fourth image data generated from the fourth subgroup, and the fifth image data generated from the fifth subgroup to calculate a fourth average value.

The signal processing circuit may generate raw data using the first average value of the first color filter CF1, the second average value of the second color filter CF2, the third average value of the third color filter CF3, and the fourth average value of the fourth color filter CF4.

The signal processing circuit may interpolate a color using the raw data and may output an image.

Figure 15:
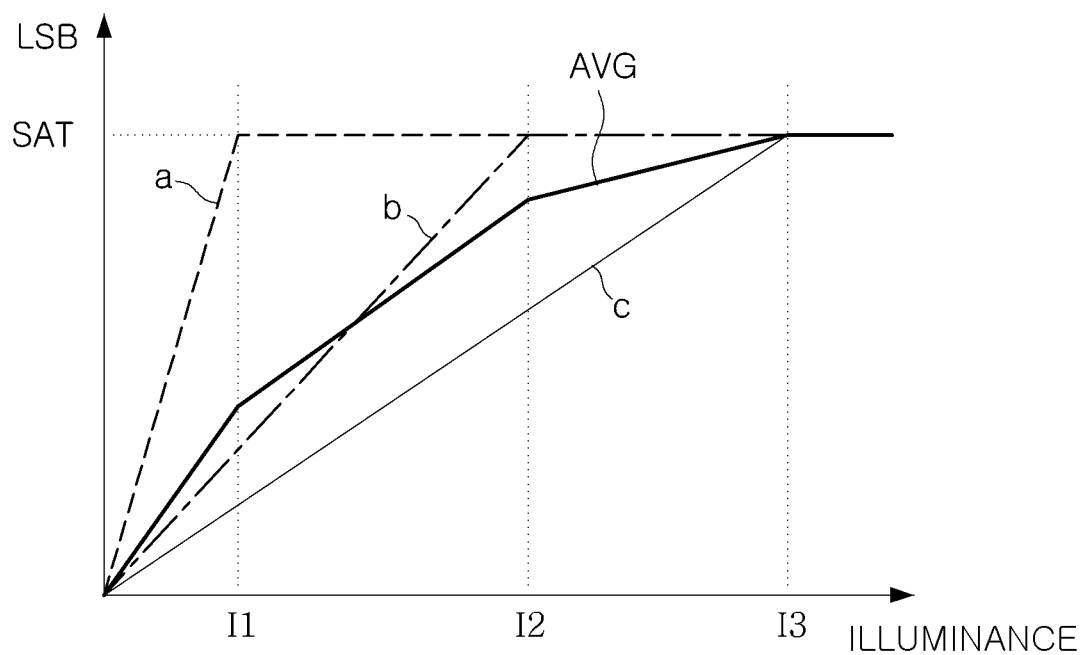
FIG. 15 illustrates sensitivity of an image sensor according to embodiments of the inventive concept.

FIG. 15 is another graph illustrating image data (LSB) sensitivity (e.g., the output of an analog-to-digital converter) as a function of incident light illuminance for an image sensor according to embodiments of the inventive concept.

Referring to FIGS. 14 and 15 together, a plot 'a' of FIG. 15 indicates the first image data generated from a first pixel group SP1 included in the first color filter CF1 in FIG. 14. A plot 'b' of FIG. 15 indicates the second image data generated from the second pixel group SP2 included in the first color filter CF1 and the fourth image data generated from the third pixel group SP3 in FIG. 14, and a plot 'c' of FIG. 15 indicates the third image data generated from the second pixel group SP2 included in the first color filter CF1 and the fifth image data generated from the third pixel group SP3 in FIG. 14.

Since the incident light receiving area of the second subgroup of the second pixel group SP2 and the incident light receiving area of the fourth subgroup of the third pixel group SP3 are the same, the second subgroup of the second pixel group SP2 may have the same sensitivity as the fourth subgroups of the three pixel group SP3. Thus, the second subgroup and the fourth subgroup may have the same plot 'b'.

Since the incident light receiving area of the third subgroup of the second pixel group SP2 and the incident light receiving area of the fifth subgroup of the third pixel group SP3 are the same, the third subgroup of the second pixel group SP2 may have the same sensitivity as the fifth subgroups of the third pixel group SP3. Thus, the third subgroup of the second pixel group SP2 and the fifth subgroup of the third pixel group SP3 may have the same plot 'c'.

Since the incident light receiving area of the first subgroup of the first pixel group SP1 is larger than the incident light receiving area of each of the second subgroup and the third subgroup of the second pixel group SP2, the first pixel group SP1 of the first subgroup SP1 may have higher sensitivity than each of the second subgroup and the third subgroups of the second pixel group SP2. Thus, the first subgroup of the first pixel group SP1 may have the plot 'a' different from the plot 'b' and the plot 'c'.

When image data is generated from the first subgroup of the first pixel group SP1, an output of the analog-to-digital converter may become saturated relatively first. When image data is generated from the third subgroup of the second pixel group SP2 and the fifth subgroup of the third pixel group SP3, an output of the analog-to-digital converter may become saturated more slowly. For example, the plot 'a' may be saturated at first illuminance I1, the plot 'b' may be saturated at second illuminance I2 higher than the first illuminance I1, and the plot 'c' may be saturated at third illuminance I3 higher than the second illuminance I2.

When an image is generated by taking an average of the first image data to the fifth image data, the sensitivity of the image sensor may have a graph AVG different from plot 'a', plot 'b', or plot 'c'. In the graph AVG, the sensitivity of the image sensor may be relatively higher at low illuminance than in the plot 'b', but time required to saturate an output of the analog-to-digital converter may be delayed as compared to the graphs 'a' and 'c'. Thus, noise characteristics and dynamic range of image sensors according to embodiments of the inventive concept may be improved.

Figure 16:
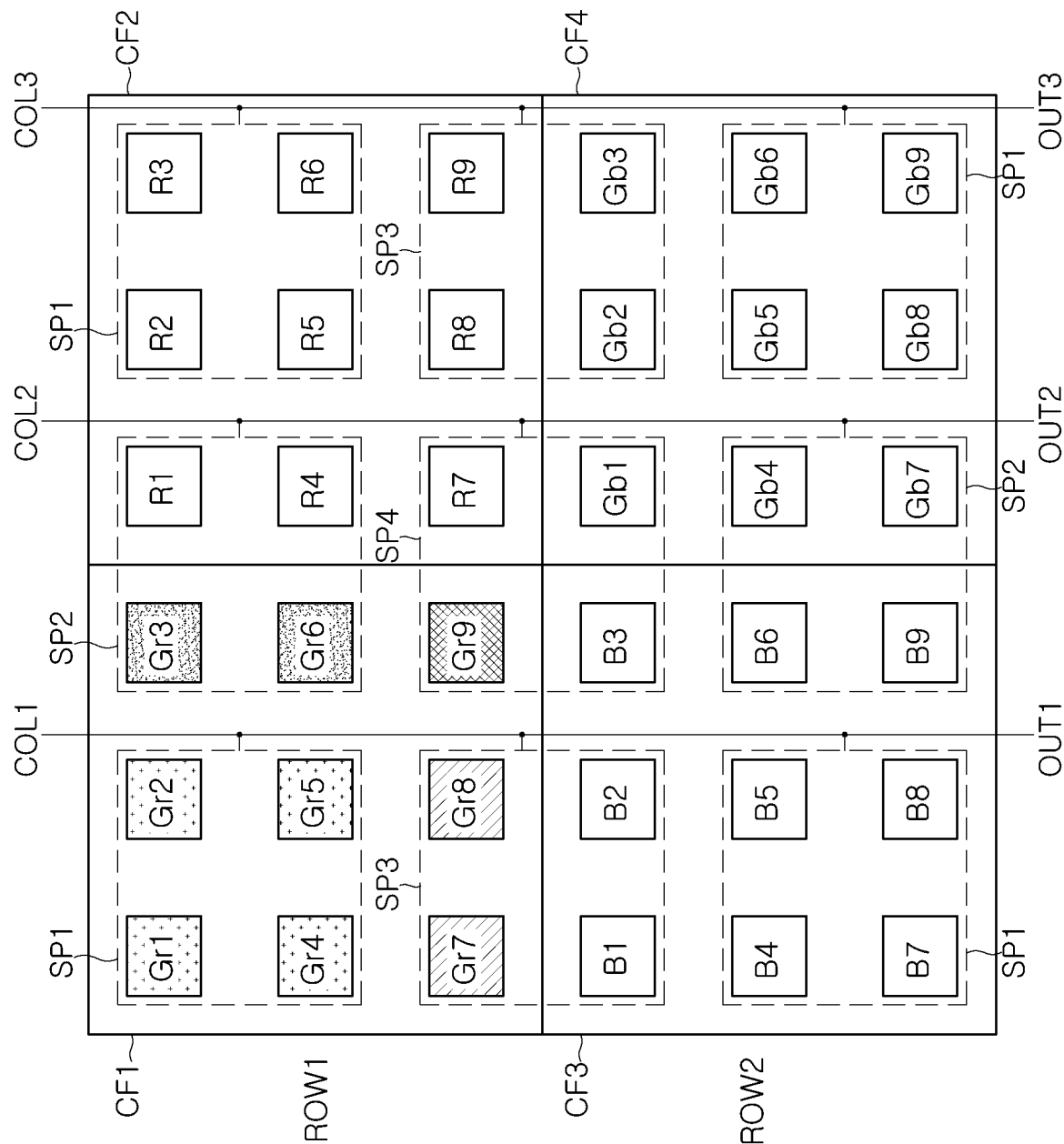
FIGS. 16, 17 and 18 are diagrams illustrating a pixel array of an image sensor according to embodiments of the inventive concept.
Figure 17:
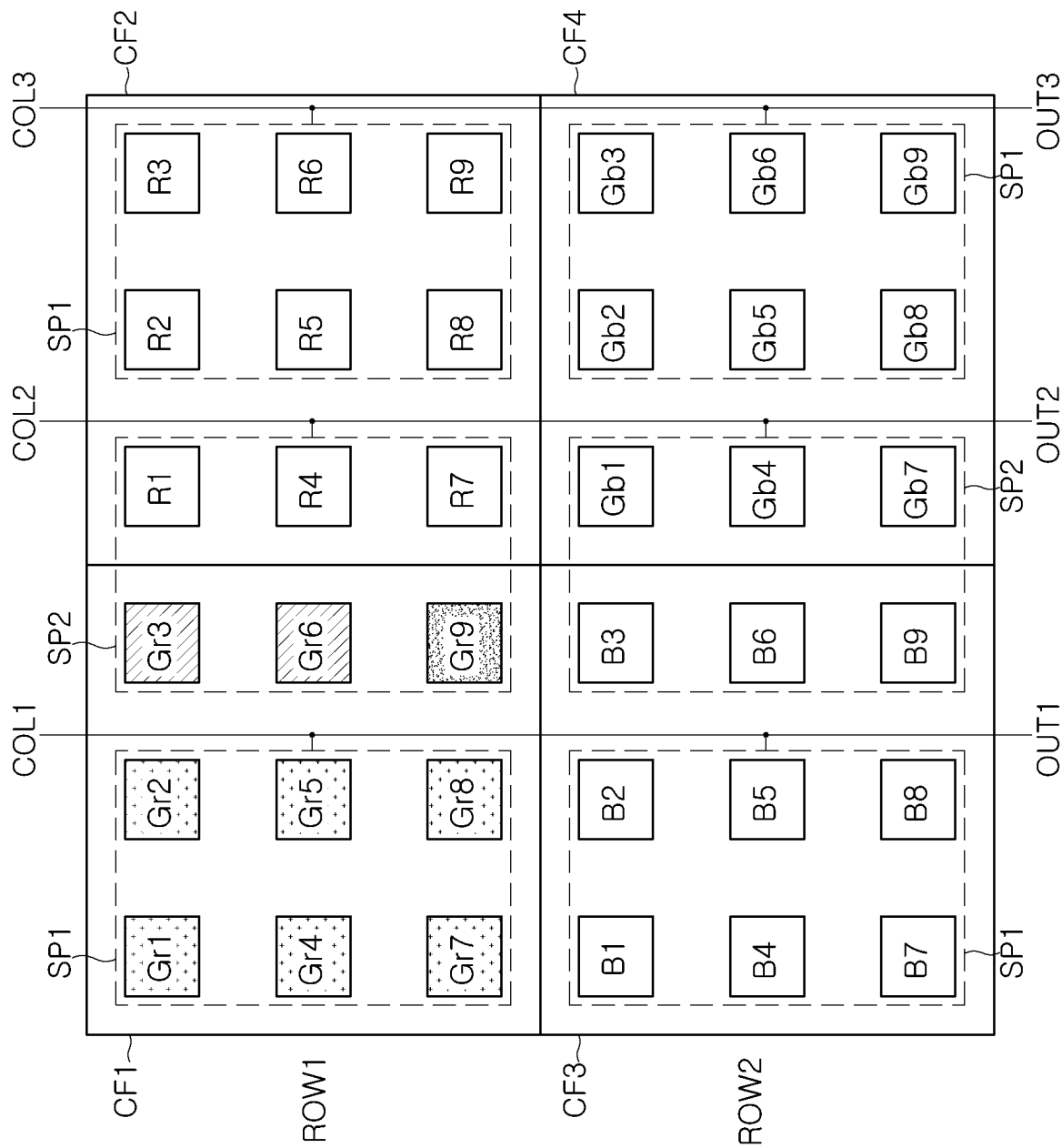
Figure 18:
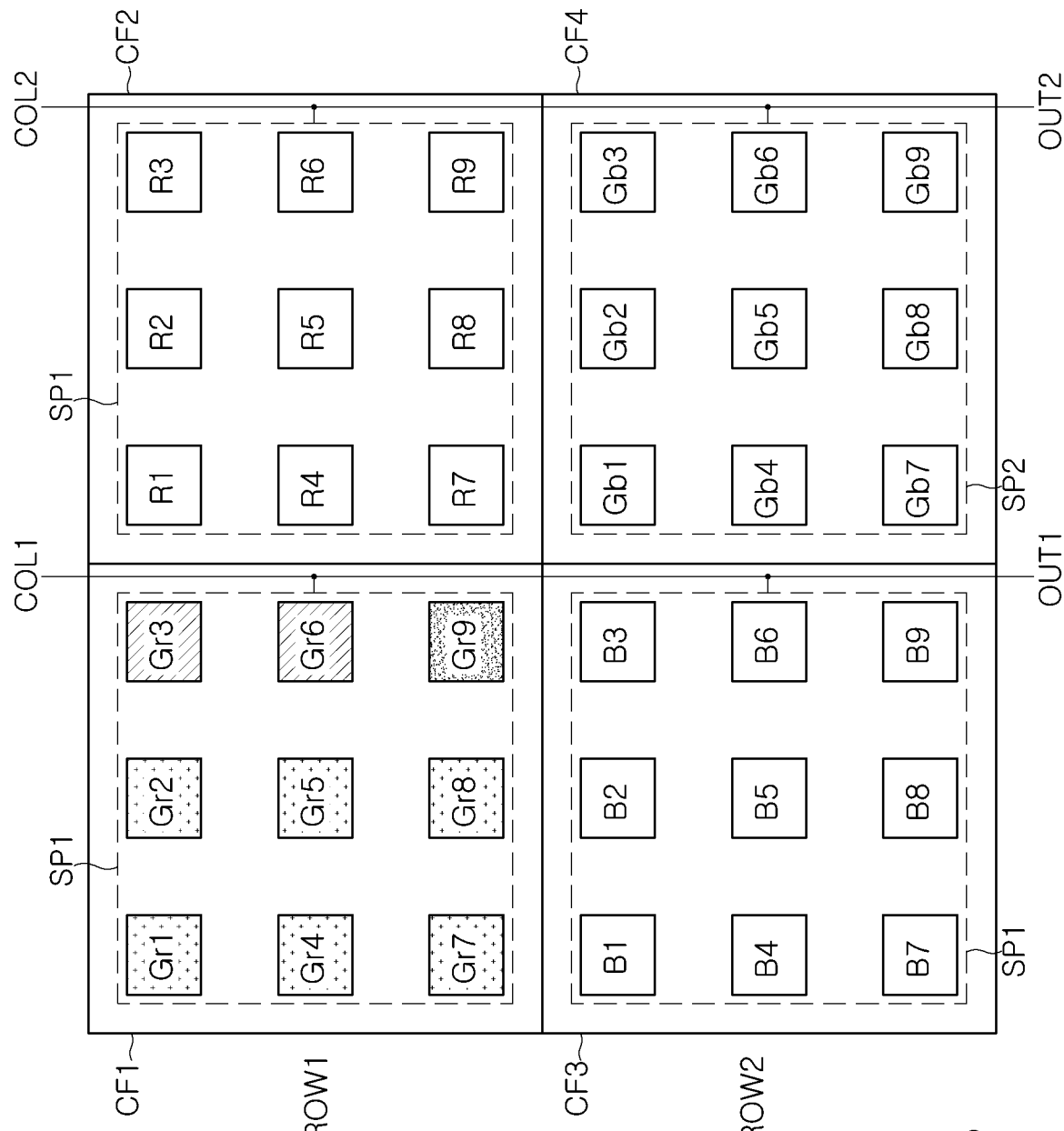

FIGS. 16, 17 and 18 respective diagrams illustrating, in part, various pixel arrays that may be incorporated in an image sensor according to embodiments of the inventive concept. Unlike the pixel array of FIG. 14, the pixel arrays of FIGS. 16 and 17 may have a shared pixel structure deviating from a pattern of a color filter. Thus, unit pixel arranged to form a pixel group need not be "merged in associated with a single color filter" as was assumed in the embodiments previously described.

Referring to FIG. 16, among green unit pixels Gr1 to Gr9 merged into a first color filter CF1, a first green unit pixel Gr1, a second green unit pixel Gr2, a fourth unit pixel Gr4, and a fifth green unit pixel Gr5 may constitute a first pixel group SP1.

A third green unit pixel Gr3 and a sixth green unit pixel Gr6, among the green unit pixels Gr1 to Gr9 merged into the first color filter CF1, and a first red unit pixel R1 and a fourth red unit pixel R4, among red unit pixels R1 to R9 merged into a second color filter CF2, may constitute a second pixel group SP2.

A seventh green unit pixel Gr7 and an eighth green unit pixel Gr8, among the green unit pixels Gr1 to Gr9 merged into the first color filter CF1, and a first blue unit pixel B1 and a second blue unit pixel B2, among blue unit pixels B1 to B9 merged into a third color filter CF3, may constitute a third pixel group SP3.

A ninth green unit pixel Gr7 among the green unit pixels Gr1 to Gr9 merged into the first color filter CF1, and a seventh red unit pixel R7 among the red unit pixels R1 to R9 merged into the second color filter CF2, a third blue unit pixel B2 among the blue unit pixels B1 to B9 merged into the third color filter CF3, and a first green unit pixel Gb1 among green unit pixels Gb1 to Gb9 merged into a fourth color filter CF4 may constitute a fourth pixel group SP4.

For the first color filter CF1, the first green unit pixel Gr1, the second green unit pixel Gr2, the fourth green unit pixel Gr4, and the fifth green unit pixel Gr5 of the first pixel group SP1 may constitute a first subgroup. The third green unit pixel Gr3 and the sixth green unit pixel Gr6 of the second pixel group SP2 may constitute a second subgroup. The seventh green unit pixel Gr7 and the eighth green unit pixel Gr8 of the third pixel group SP3 may constitute a third subgroup. In the fourth pixel group SP4, the ninth green unit pixel Gr9 may constitute a fourth subgroup.

Referring to FIG. 17, among green unit pixels Gr1 to Gr9 merged into a first color filter CF1, a first green unit pixel Gr1, a second green unit pixel Gr2, a fourth green color Gr4, a fifth green unit pixel Gr5, a seventh green unit pixel Gr7, and an eighth green unit pixel Gr8 may constitute a first pixel group SP1.

A third green unit pixel Gr3, a sixth green unit pixel Gr6, and a ninth green unit pixel Gr9, among the green unit pixels Gr1 to Gr9 merged into the first color filter CF1, a first red unit pixel R1, a fourth red unit pixel R4, and a seventh red unit pixel R7, among red unit pixels R1 to R9 merged into the second color filter CF2, may constitute a second pixel group SP2.

For the first color filter CF1, the first green unit pixel Gr1, the second green unit pixel Gr2, the fourth green unit pixel Gr4, and the fifth green unit pixel Gr5, the seventh green unit pixel Gr7, and the eighth green unit pixel Gr8 of the first pixel group SP1 may constitute a first subgroup. The third green unit pixel Gr3 and the sixth green unit pixel Gr6 of the second pixel group SP2 may constitute a second subgroup. The ninth green unit pixel Gr9 of the second pixel group SP2 may constitute a third subgroup.

Referring to FIG. 18, green unit pixels Gr1 to Gr9 merged into a first color filter CF1 may constitute a first pixel group SP1. Red unit pixels R1 to R9 merged into a second color filter CF2 may constitute a first pixel group SP1. Blue unit pixels B1 to B9 merged into a third color filter CF3 may constitute a first pixel group SP1. Green unit pixels Gb1 to Gb9 merged into a fourth color filter CF4 may constitute a first pixel group SP1.

Figure 19:
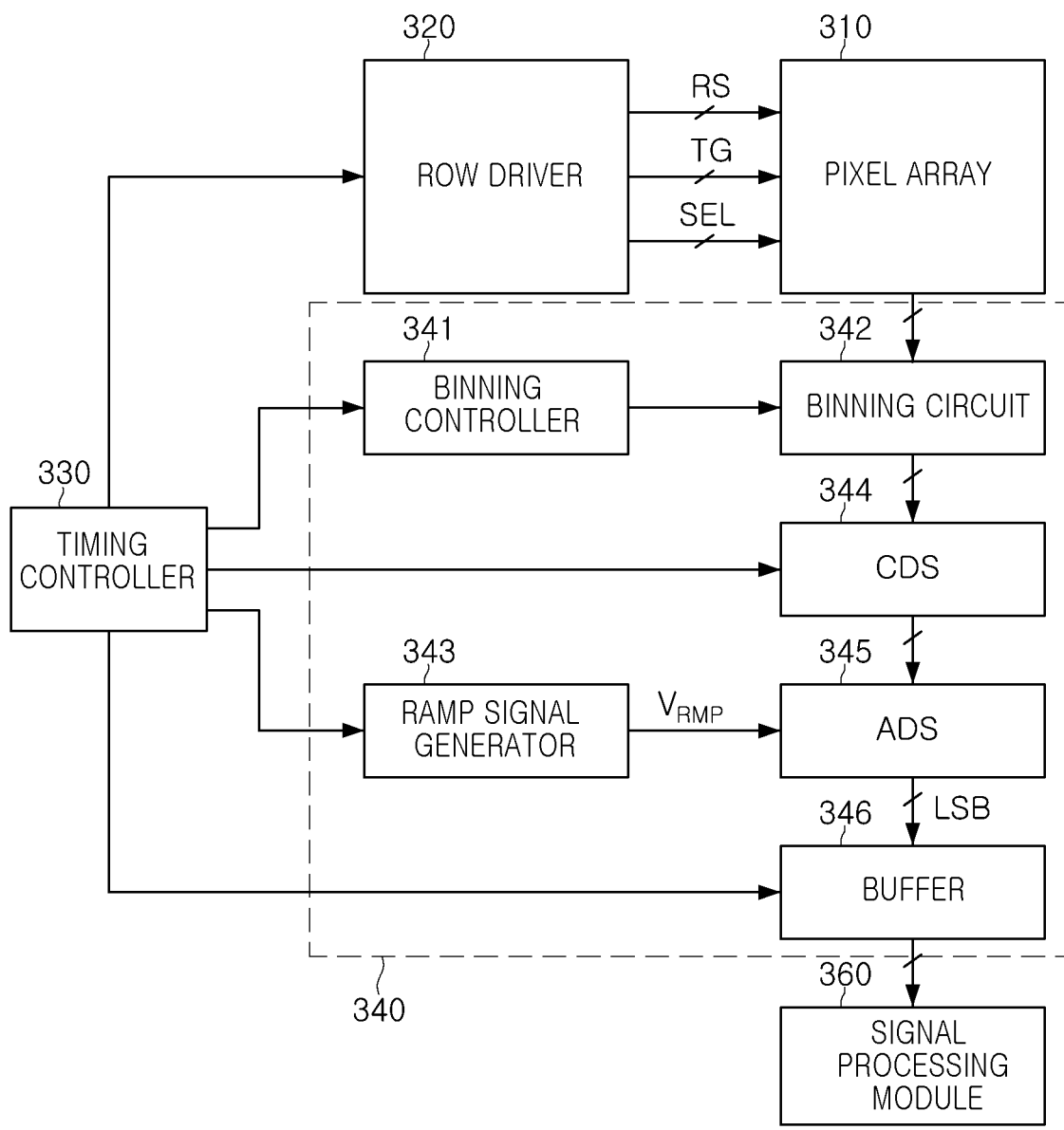
FIG. 19 is a block diagram illustrating an image sensor according to embodiments of the inventive concept.

FIG. 19 is a block diagram of an image sensor 300 according to embodiments of the inventive concept.

Referring to FIG. 19, the image sensor 300 may include a pixel array 310, a row driver 320, a timing controller 330, a read-out circuit 340, and a signal processing circuit 360. The read-out circuit 130 may include a binning controller 341, a binning circuit 342, a ramp signal generator 343, a sampling circuit 344, an analog-to-digital converter 345, and a buffer 346. The binning controller 341 may control the binning circuit 342.

In view of the previous embodiments described in relation to one or more of FIGS. 1 to 18, the descriptions have been given with regard to embodiments in which an image sensor takes an average of image data to calculate an average value. However, the binning circuit 342 of FIG. 19 may detect a reset voltage and a pixel voltage from unit pixels sharing a single color filter in respective subgroup, may take an average of the reset voltages detected in the subgroups to calculate a reset average value, and may take an average the pixel voltages detected in the subgroups to calculate a pixel average value.

For example, referring to FIG. 14, a first reset voltage and the first pixel voltage may be detected from the first floating diffusion region of the first subgroup, and the second reset voltage and the second pixel voltage may be detected from the second floating diffusion region of the second subgroup, the third reset voltage and the third pixel voltage may be detected from the second floating diffusion region of the third subgroup, the fourth reset voltage and the fourth reset voltage may be detected from the third floating diffusion region of the fourth subgroup, and the fifth reset voltage and the fifth pixel voltage may be detected from the third floating diffusion region of the fifth subgroup.

An average of the first to fifth reset voltages may be taken to calculate a reset average value, and an average of the first to fifth pixel voltages may be taken to calculate a pixel average value.

Referring to FIG. 19, the sampling circuit 344 may output a difference between the reset average value and the pixel average value as an analog signal. The analog-to-digital converter 345 may compare the analog signal with a ramp voltage VRMP, may convert a comparison result into a digital signal, and may output the digital signal as image data LSB. The buffer 346 may temporarily store the image data LSB received from the analog-to-digital converter 345.

The signal processing circuit 360 may generate an image using the image data LSB transmitted from the buffer 346. The signal processing circuit 360 may process the image data LSB and may output the processed image data as an image.

According to embodiments, the image sensor 300 may not include the binning controller 341 and the binning circuit 342. The image sensor 300 may detect a reset voltage and a pixel voltage for respective subgroups from unit pixels sharing one color filter in a column line, may take an average of the reset voltages detected in the subgroups to calculate a reset average value, and may take an average of the pixel voltages detected in the subgroups to calculate a pixel average value.

Figure 20:
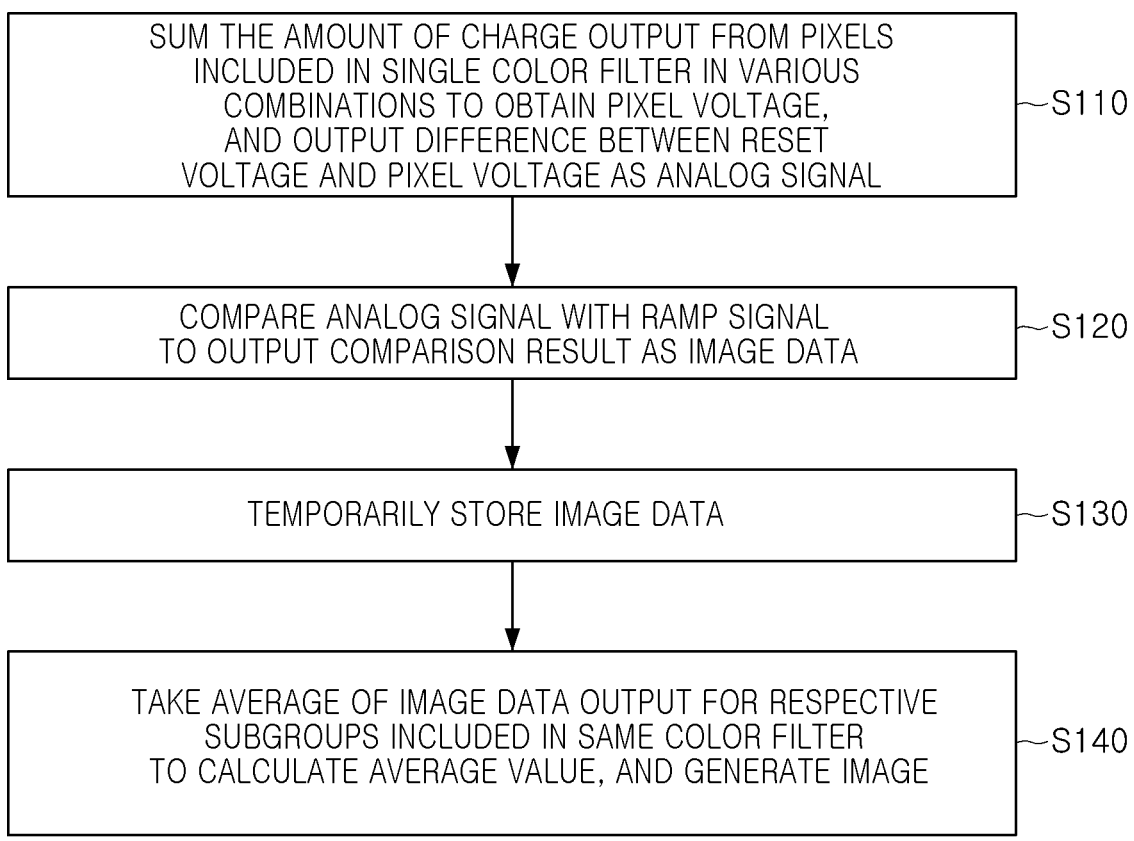
FIGS. 20 and 21 are flowcharts summarizing operating method(s) for an image sensor according to embodiments of the inventive concept.

FIG. 20 is a flowchart summarizing an operating method for an image sensor according to embodiments of the inventive concept.

Referring to FIG. 20, an image sensor may sum the amount of charge output from unit pixels included in a single color filter in various combinations to obtain a pixel voltage. The image sensor may output a difference between a reset voltage and the pixel voltage as an analog signal (S110).

The image sensor may compare the analog signal with a ramp voltage, may convert a comparison result into a digital signal, and may output the digital signal as image data (S120).

The image sensor may temporarily store the image data (S130).

The image sensor may generate an image using the image data (S140). For example, the image sensor may take an average of image data, output for respective subgroups included in a single color filter, to calculate an average value and may generate an image using the average value.

Figure 21:
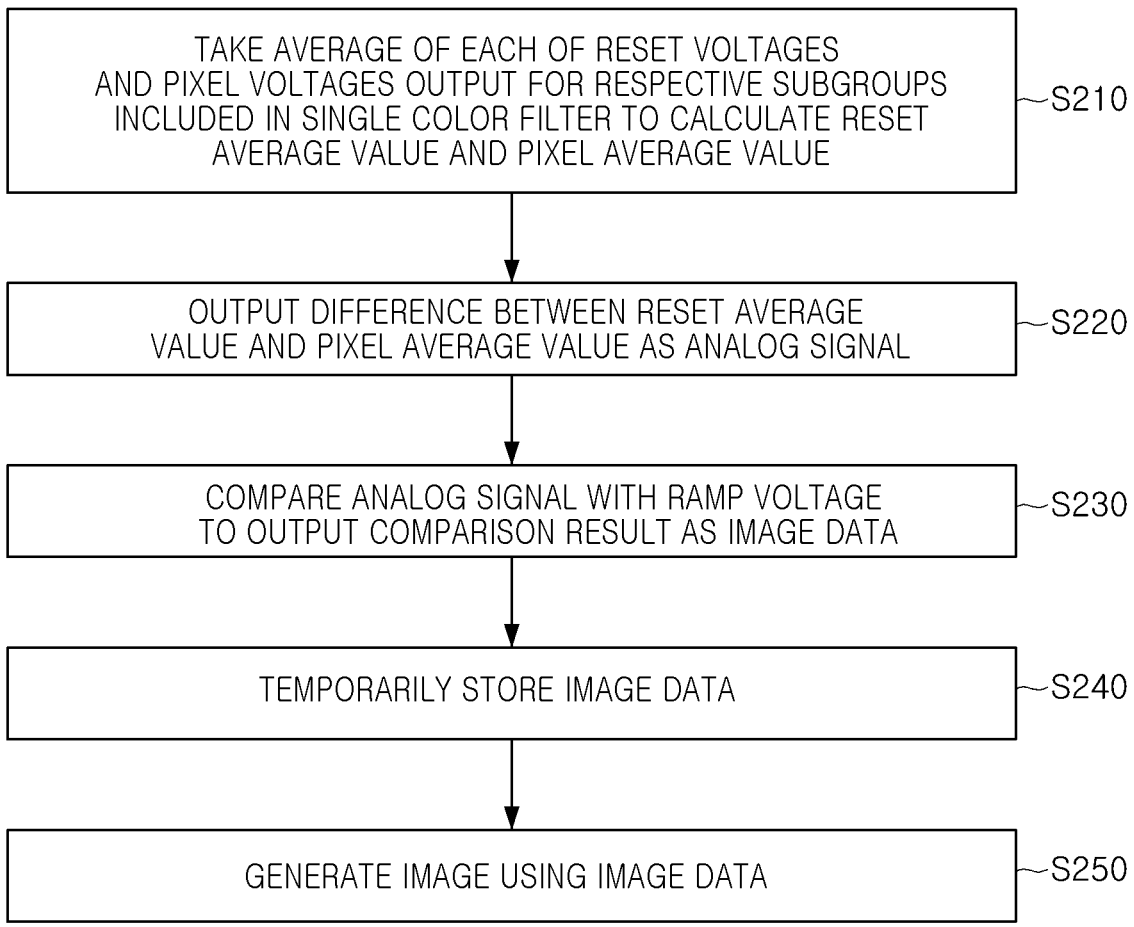

FIG. 21 is another flowchart summarizing an operating method for an image sensor according to embodiments of the inventive concept.

Referring to FIG. 21, an image sensor may detect a reset voltage and a pixel voltage for respective subgroups included in a single color filter, may take an average of reset voltages output from the subgroups to calculate a reset average value, and may take an average of pixel voltages output from the subgroups to calculate a pixel average value (S110).

The image sensor may output a difference between the reset average value and the pixel average value as an analog signal (S120).

The image sensor may compare the analog signal with a ramp voltage, may convert a comparison result into a digital signal, and may output the digital signal as image data (S130).

The image sensor may temporarily store the image data (S140).

The image sensor may generate an image using the image data (S150).

Figure 22:
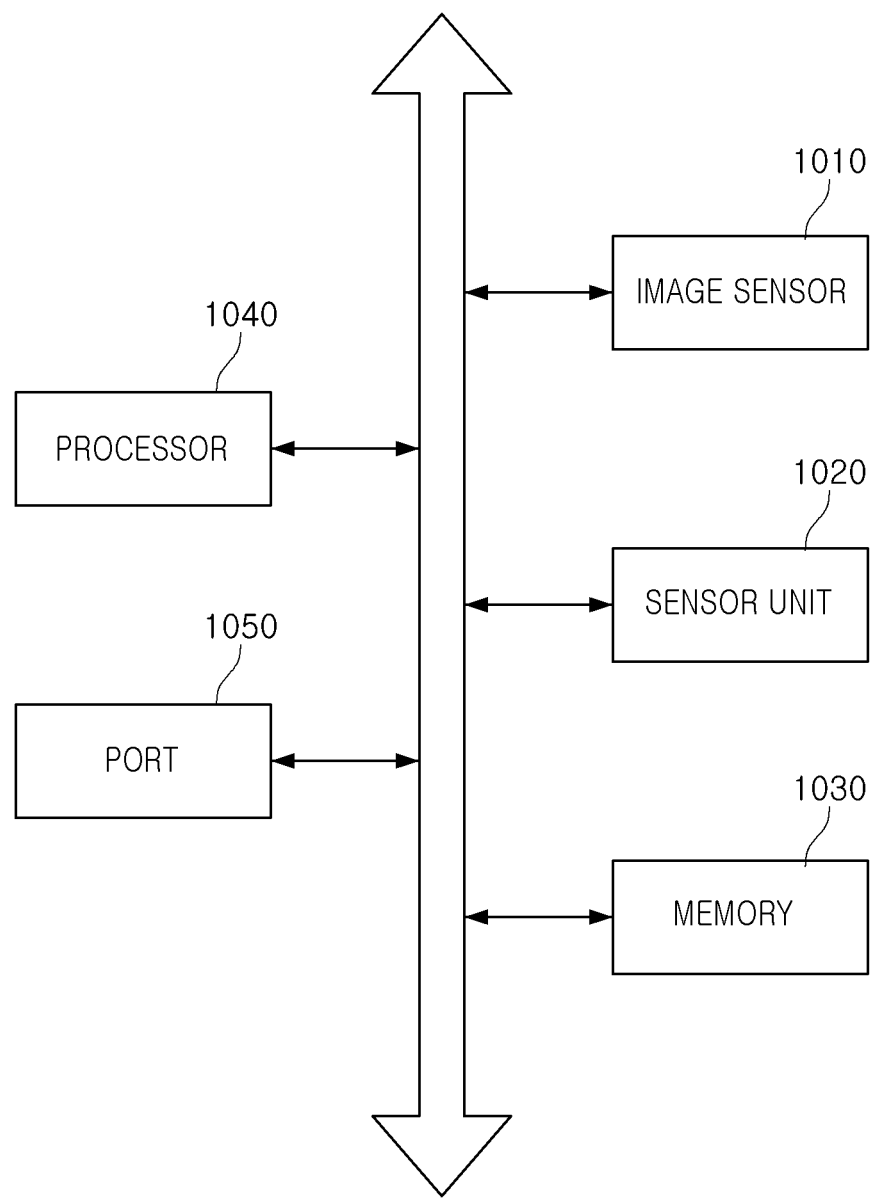
FIG. 22 is a general block diagram illustrating a computer device including an image sensor according to embodiments of the inventive concept.

FIG. 22 is a general block diagram illustrating a computer device 1000 including an image sensor according to embodiments of the inventive concept.

The computer device 1000 of FIG. 22 may include a display 1010, a sensor unit 1020, a memory 1030, a processor 1040, a port 1050, and the like. The computer device 1000 may further include a wired/wireless communications device, a power supply device, or the like. Among the components illustrated in FIG. 22, the port 1050 may be an element for communicating with a video card, a sound card, a memory card, an USB card, or the like. The computer device 1000 may be a smartphone, a tablet personal computer (PC), a smart wearable device, or the like, in addition to a general desktop computer or a laptop computer.

The processor 1040 may perform a certain calculation and may process a command word, a task, and the like. The processor 1040 may be a central processor unit (CPU), a microprocessor unit (MCU), a system-on-chip (SoC), or the like, and may communicate with the display 1010, the sensor unit 1020, and the memory device 1030 through a bus 1060, and may also communicate with other devices connected to the port 1050.

The memory 1030 may be a storage medium for storing data used for operation of the computer device 1000, multimedia data, and the like. The memory 1030 may include a volatile memory such as a random access memory (RAM), or a nonvolatile memory such as a flash memory. The memory 1030 may include at least one of a solid state drive (SSD), a hard disk drive (HDD), or an optical disk drive (ODD) as a storage device. An input/output device may include an input device such as a keyboard, a mouse, a touchscreen, and the like, and an output device such as a display, an audio output unit, and the like, provided to a user.

The sensor unit 1020 may include various sensors such as an image sensor, a gyro sensor, a GPS sensor, an illuminance sensor, and the like. An image sensor, included in the sensor unit 1020, may be employed in the computer device 1000 in the form based on various embodiments described with reference to FIGS. 1 to 21.

As described above, according to various embodiments, charge output from unit pixels sharing a single color filter may be summed in various combinations. Thus, noise characteristics and dynamic range of an image sensor according to the inventive concept may be improved. In addition, a fabrication process for the image sensor may be simplified, and a frame rate of the image sensor may be high.

While embodiments have been shown and described above, it will be apparent to those skilled in the art that modifications and variations could be made without departing from the scope of the present inventive concept as defined by the appended claims.

What is claimed is:

1. An image sensor comprising:
   a pixel array including:
      a first pixel group including a first unit pixel and a second unit pixel sharing a first floating diffusion region and associated with a color filter, and
      a second pixel group including a third unit pixel and a fourth unit pixel sharing a second floating diffusion region and associated with the color filter;
   a sampling circuit configured to:
      detect at least one reset voltage and at least one pixel voltage from at least one of the first pixel group and the second pixel group, and
      provide a difference between the reset voltage and the pixel voltage as an analog signal;
   an analog-to-digital converter configured to compare the analog signal with a ramp voltage to generate a comparison result, convert the comparison result into a digital signal, and provide the digital signal as image data; and
   a signal processing circuit configured to generate an image using the image data, wherein:
   the signal processing circuit is further configured to:

detect a first reset voltage and a first pixel voltage from the first floating diffusion region;

detect a second reset voltage and a second pixel voltage from the second floating diffusion region;

take an average of the first reset voltage and the second reset voltage to calculate a reset average value; and take an average of the first pixel voltage and the second pixel voltage to calculate a pixel average value, the first pixel voltage of the first pixel group corresponds to charges generated by the first unit pixel and the second unit pixel in response to incident light and simultaneously summed in the first floating diffusion region, and the second pixel voltage of the second pixel group corresponds to charges generated by the third unit pixel and the fourth unit pixel in response to incident light and simultaneously summed in the second floating diffusion region.

2. The image sensor of claim 1, wherein the first pixel group and the second pixel group have different sized light receiving areas.

3. The image sensor of claim 1, wherein a frame rate is higher than a frame rate in which an image is generated using image data from all unit pixels individually.

4. The image sensor of claim 1, wherein:

each one of the first unit pixel, the second unit pixel, the third unit pixel, and the fourth unit pixel includes a photodiode and a transfer transistor connected to the photodiode, the first unit pixel and the second unit pixel are connected to a first pixel circuit, and the third unit pixel and the fourth unit pixel are connected to a second pixel circuit.

5. The image sensor of claim 4, wherein the first pixel circuit includes:

a first driving transistor configured to generate a voltage corresponding to charge accumulated in the first floating diffusion region, a first select transistor configured to provide a voltage generated by the first driving transistor to the sampling circuit, and a first reset transistor configured to reset the first floating diffusion region.

6. The image sensor of claim 5, wherein the second pixel circuit includes:

a second driving transistor configured to generate a voltage corresponding to charge accumulated in the second floating diffusion region, a second select transistor configured to provide a voltage generated by the second driving transistor to the sampling circuit, and a second reset transistor configured to reset the second floating diffusion region.

7. The image sensor of claim 1, wherein the image sensor:

adjusts ON/OFF timing of respective transfer transistors of the first pixel group to be the same, and adjusts ON/OFF timing of respective transfer transistors of the second pixel group to be different.

8. The image sensor of claim 7, wherein unit pixels of the first pixel group provide a first subgroup exhibiting a first sensitivity level and a second subgroup exhibiting a second sensitivity level different from the first sensitivity level, depending on ON/OFF timing of the respective transfer transistors of the first pixel group.

9. The image sensor of claim 8, wherein the first subgroup and the second subgroup have different incident light receiving areas.

10. An image sensor comprising:

a pixel array including unit pixels, wherein:

the unit pixels include a first unit pixel and a columnar-adjacent second unit pixel sharing a first floating diffusion region, associated with a single color filter, and forming a first pixel group, and the unit pixels include a third unit pixel and a columnar-adjacent fourth unit pixel sharing a second floating diffusion region, associated with the single color filter, and forming a second pixel group different from the first pixel group; and control logic configured to generate an image by:

obtaining capacitance having a first value from the first floating diffusion region at a first time, and obtaining capacitance having a second value different from the first value from the second floating diffusion region at a second time following the first time, wherein:

the control logic is further configured to:

detect a first reset voltage and a first pixel voltage from the first floating diffusion region, detect a second reset voltage and a second pixel voltage from the second floating diffusion region, take an average of the first reset voltage and the second reset voltage to calculate a reset average value, and take an average of the first pixel voltage and the second pixel voltage to calculate a pixel average value, the first pixel voltage corresponds to a first capacitance value of the first floating diffusion region at the first time, and the second pixel voltage corresponds to a second capacitance value of the second floating diffusion region at the second time.

11. The image sensor of claim 10, wherein among unit pixels having a color different from a color of the single color filter and sharing another color filter adjacent to the single color filter, at least a portion of the unit pixels shares the second floating diffusion region with the second pixel group.

12. The image sensor of claim 10, wherein the control logic is further configured to generate:

first image data from the capacitance having the first value, generate second image data from the capacitance having the second value, and generate the image using the first image data and the second image data.

13. The image sensor of claim 12, wherein the control logic is further configured to take an average of the first image data and the second image data to calculate an average value and generate the image using the average value.

14. The image sensor of claim 12, wherein:

the control logic is further configured to generate the image by obtaining capacitance having a third value from the second floating diffusion region at a third time following the second time, generate third image data from the capacitance having the third value, and generate image data using the third image data in addition to first image data and the second image data.

15. The image sensor of claim 10, wherein the unit pixels provide:

a first subgroup that adjusts capacitance of the first floating diffusion region to have the first value, and a second subgroup that adjusts capacitance of the second floating diffusion region to have the second value.

16. The image sensor of claim 15, wherein the first subgroup and the second subgroup have different sensitivity levels.

17. The image sensor of claim 10, wherein the control logic is further configured to:
generate a difference between the reset average value and the pixel average value as an analog signal,
compare the analog signal with a ramp voltage to generate a comparison result,
convert the comparison result into a digital signal,
provide the digital signal as image data, and
generate the image using the image data.

18. The image sensor of claim 10, wherein:
the control logic is further configured to:
obtain capacitance having a third value from the second floating diffusion region at a third time following the second time,
detect a third reset voltage and a third pixel voltage from the second floating diffusion region,
take an average of the first reset voltage, the second reset voltage, and the third reset voltage to calculate a reset average value, and
take an average of the first pixel voltage, the second pixel voltage, and the third pixel voltage to calculate a pixel average value, and
the third pixel voltage corresponds to capacitance having a third value of the second floating diffusion region.

* * * * *